US012740326B2

(12) United States Patent
Samant et al.

(10) Patent No.: US 12,740,326 B2
(45) Date of Patent: Sep. 15, 2026

(54) INTERFACIAL NITRIDATION FOR GROWTH OF PERPENDICULARLY MAGNETIZED HEUSLER FILMS

(71) Applicants: International Business Machines Corporation, Armonk, NY (US); Samsung Electronics Co., Ltd., Gyeonggi-do (KR)

(72) Inventors: Mahesh Samant, San Jose, CA (US); Panagiotis Charilaos Filippou, Fremont, CA (US); Chirag Garg, San Jose, CA (US); See-Hun Yang, Morgan Hill, CA (US); Fnu Ikhtiar, San Jose, CA (US); Jaewoo Jeong, Los Altos, CA (US); Roman Chepulskyy, Santa Clara, CA (US)

(73) Assignees: INTERNATIONAL BUSINESS MACHINES CORPORATION, Armonk, NY (US); SAMSUNG ELECTRONICS CO., LTD. (KR)

( * ) Notice: Subject to any disclaimer, the term of this patent is extended or adjusted under 35 U.S.C. 154(b) by 436 days.

(21) Appl. No.: 18/231,734

(22) Filed: Aug. 8, 2023

(65) Prior Publication Data

US 2025/0057050 A1 Feb. 13, 2025

(51) Int. Cl.
*H10N 50/80* (2023.01)
*H10B 61/00* (2023.01)
(Continued)

(52) U.S. Cl.
CPC ............. *H10N 50/80* (2023.02); *H10B 61/00* (2023.02); *H10N 50/01* (2023.02); *H10N 50/20* (2023.02); *H10N 50/85* (2023.02)

(58) Field of Classification Search
CPC ................................ H10N 50/80; H01F 1/408
See application file for complete search history.

(56) References Cited

U.S. PATENT DOCUMENTS 9,349,944 B2 5/2016 Takahashi
9,406,365 B1 8/2016 Jeong
(Continued)

FOREIGN PATENT DOCUMENTS

CN 104868052 B 12/2017

OTHER PUBLICATIONS

A.J. McAlieter, The Al—Co (Aluminum-Cobalt) System, Bulletin of Alloy Phase Diagrams vol. 10 No. 6 1989, pp. 646-650 (Year: 1989).*
(Continued)

*Primary Examiner* — Shih Tsun A Chou
(74) *Attorney, Agent, or Firm* — Amin, Turocy & Watson, LLP

(57) ABSTRACT

A magnetoresistive random-access memory cell includes a substrate; a sub-monolayer nitride layer, outward of the substrate, having a sub-monolayer nitride layer thickness less than 10 Angstroms; and a templating layer, outward of the sub-monolayer nitride layer, and including a binary alloy having an alternating layer lattice structure. A Heusler layer is located outward of the templating layer. The Heusler layer includes a Heusler compound and exhibits perpendicular magnetic anisotropy (PMA). A tunnel barrier is outward of the Heusler layer, and a magnetic layer is outward of the tunnel barrier. In an alternative aspect, instead of the sub-monolayer nitride layer, a tantalum nitride layer with a thickness of ≤10 Angstroms+10% is employed.

25 Claims, 27 Drawing Sheets

(51) Int. Cl.

| | |
|---|---|
| ***H10N 50/01*** | (2023.01) |
| ***H10N 50/20*** | (2023.01) |
| ***H10N 50/85*** | (2023.01) |

(56) References Cited

U.S. PATENT DOCUMENTS

| | | | | |
|---|---|---|---|---|
| 10,395,809 | B2 | 8/2019 | Takahashi | |
| 10,453,513 | B2 | 10/2019 | Kato | |
| 10,522,742 | B2 | 12/2019 | Shiokawa | |
| 11,121,309 | B2 | 9/2021 | Lee | |
| 11,410,689 | B2 | 8/2022 | Inubushi | |
| 2016/0233333 | A1* | 8/2016 | Toh | H10D 62/822 |
| 2019/0305040 | A1* | 10/2019 | Jeong | H10B 61/00 |
| 2022/0223783 | A1 | 7/2022 | Jeong | |
| 2022/0406992 | A1* | 12/2022 | Chu | H10N 50/80 |

OTHER PUBLICATIONS

Wikipedia, Cubic crystal system, Dec. 28, 2022 (Year: 2022).*

Filippou et al., "Heusler-based synthetic antiferrimagnets," Sci. Adv. 8, eabg2469 (2022) Feb. 23, 2022.

Y. Ferrante et al., "Tetragonal Mn3Sn Heusler films with large perpendicular magnetic anisotropy deposited on metallic MnN underlayers using amorphous substrates," APL Materials 7, 031103 (2019); https://doi.org/10.1063/1.5066594.

* cited by examiner

| Nitride | Lattice Constant (Å) | TMR (%) |
|---|---|---|
| 10Å CrN | 4.09 | 60.09 |
| 10Å VN | 4.11 | 63.59 |
| 10Å TiN | 4.24 | 62.1 |
| 10Å ScN | 4.51 | 60.44 |

FIG. 6

| Nitride or Process | Thickness | TMR (%) | RA | $H_c$(VSM) | Texture (XRD) | Power | Comment (TMR/PMA) |
|---|---|---|---|---|---|---|---|
| Scandium Nitride | 0.5 Å | 50.02 | 8.81 | 6 kOe | (001) | 50W | Acceptable |
| | 5 Å | 56.59 | 5.58 | 1.7 kOe | (001) | 50W | Acceptable |
| Titanium Nitride | 0.5 Å | 52.14 | 4.9 | 8 kOe | (001) | 50W | Acceptable |
| | 5 Å | 60.79 | 7.75 | 1.3 kOe | (001) | 50W | Acceptable |
| Vanadium Nitride | 0.5 Å | 51.34 | 6.02 | 10 kOe | (001) | 50W | Acceptable |
| | 5 Å | 58.83 | 7.13 | 4 kOe | (001) | 50W | Acceptable |
| Tantalum Nitride | 1 Å | 50.43 | 9.67 | 10 kOe | (001) | 30W | Acceptable |
| | 10 Å | 56.98 | 9.11 | 10 kOe | (001) | 30W | Acceptable |
| Chromium Nitride | 0.5 Å (3 sec) | 51.89 | 4.88 | 10 kOe | (001) | 50W | Acceptable |
| Iron Nitride | 0.5 Å (3 sec) | 38.88 | 9.86 | 3.5 kOe | (001) and (011) | 50W | Unacceptable |
| Cobalt-Iron-Boron Nitride | 0.5 Å (3 sec) | 15.98 | 6.99 | 1.4 kOe | (001) and (011) | 50W | Unacceptable |
| Nitrogen Exposure, IBD (1.5sccmKr-1sccmN2) | (1 sec) | 24.5 | 5.33 | NA | (001) and (011) | NA | Unacceptable |
| Nitrogen Exposure, Sputter (85/15) | (10 sec) | 0.34 | 6.5 | 0 | (001) and (011) | 50W | Unacceptable |
| No Nitride | - | 0.47 | 5.67 | 0 | (001) and (011) | - | Unacceptable |

FIG. 13

INTERFACIAL NITRIDATION FOR GROWTH OF PERPENDICULARLY MAGNETIZED HEUSLER FILMS

BACKGROUND

The present invention relates generally to the electrical, electronic and computer arts and, more particularly, to magnetoresistive random-access memory (MRAM).

Current MRAM devices use a magnetic tunnel junction (MTJ) as a storage element. A simple MTJ is a tri-layer structure containing two magnetic layers separated by a tunnel barrier layer. The magnetic state of one of the layers is switched using Spin Transfer Torque (STT). Thus, current MRAMs are three-layer devices employing a magnetic tunnel junction (MTJ). They typically include a reference layer magnet, a tunnel barrier, and a storage or free magnetic layer. The magnetic layer can either be a ferromagnet or a ferrimagnet. Current is passed through the device and the resistance is measured. The resistance changes based on the magnetic orientation of the two magnetic layers, and the relative change in resistance is referred to as the tunnel magnetoresistance (TMR), which is related to the spin polarization (i.e., high spin polarization implies high TMR). High spin polarization, and thus high TMR, is desirable (higher TMR provides a higher ON/OFF ratio). Low switching current is also desirable.

In a parallel configuration (e.g., storing a zero), the magnetic layers have their magnetizations aligned with each other; the resistance is typically lower in this state relative to the anti-parallel configuration (e.g., storing a one). In the anti-parallel state, the magnetic layers do not have their magnetizations aligned with each other; the resistance is typically higher in this state relative to the parallel configuration. The magnetic state of the MTJ is changed by passing a current through it. The current delivers spin angular momentum, so that once a threshold current is exceeded, the direction of the memory layer moment is switched. Since these MRAM devices are switched using STT, they are referred to as STT-MRAM. The magnitude of the switching current that is required is less when the magnetization of the electrodes is oriented perpendicular to the layers. The magnetic layers have magnetization perpendicular to the film surface (i.e. have perpendicular magnetic anisotropy (PMA)) as smaller switching currents are needed than for in-plane magnetized MTJs. MTJs with magnetic layers having PMA need smaller switching current than for in-plane magnetized layers.

Current devices employ alloys of cobalt, iron, and boron for the magnetic layers and these layers are ferromagnetic (such current devices do not scale well to smaller sizes). Heusler compounds are magnetic intermetallics with a face-centered cubic (FCC) crystal structure and a composition of $X_2YZ$ (full-Heuslers or simply "Heuslers"), where X and Y are transition metals and Z is in the p-block (or main group) of the periodic table. Half Heuslers have the composition XYZ. Reference herein to Heusler or Heuslers without the term "half" is intended to reference full-Heuslers. Heusler compounds have four interpenetrating FCC sublattices. CoFeB devices typically need surface anisotropy for PMA, while Heusler compounds typically are PMA due to volume anisotropy.

BRIEF SUMMARY

Principles of the invention provide interfacial nitridation for growth of perpendicularly magnetized Heusler films. In one aspect, an exemplary magnetoresistive random-access memory cell includes a substrate; a sub-monolayer nitride layer, outward of the substrate, and having a sub-monolayer nitride layer thickness less than 10 Angstroms; and a templating layer, outward of the sub-monolayer nitride layer, including a binary alloy having an alternating layer lattice structure. A Heusler layer is located outward of the templating layer. The Heusler layer includes a Heusler compound and exhibits perpendicular magnetic anisotropy (PMA). A tunnel barrier is outward of the Heusler layer and a magnetic layer outward of the tunnel barrier.

Optionally, the Heusler layer is a storage layer and the magnetic layer is a reference layer. On the other hand, optionally, the Heusler layer is a reference layer and the magnetic layer is a storage layer.

Optionally, the Heusler compound is selected from the group consisting of $Mn_3Ge$, $Mn_3Sn$, $Mn_3Sb$, $Mn_2CoSn$, $Mn_2FeSb$, $Mn_3CoAl$, $Mn_2CoGe$, $Mn_2CoSi$, $Mn_2CuSi$, $Co_2CrAl$, $Co_2CrSi$, $Co_2MnSb$, and $Co_2MnSi$.

In another aspect, another magnetoresistive random-access memory cell includes a substrate; a tantalum nitride layer, outward of the substrate, and having a tantalum nitride layer thickness ranging from a sub-monolayer to a maximum≤10 Angstroms±10%; a templating layer, outward of the tantalum nitride layer, including a binary alloy having an alternating layer lattice structure; and a Heusler layer located outward of the templating layer. The Heusler layer includes a Heusler compound and exhibits perpendicular magnetic anisotropy (PMA). A tunnel barrier is outward of the Heusler layer. A magnetic layer is outward of the tunnel barrier.

In still another aspect, a magnetoresistive random-access memory array of such magnetoresistive random-access memory cells includes a plurality of bit lines and a plurality of complementary bit lines forming a plurality of bit line-complementary bit line pairs; a plurality of word lines intersecting the plurality of bit line pairs at a plurality of cell locations; and a plurality of magnetoresistive random-access memory cells located at each of the plurality of cell locations. Each of the magnetoresistive random-access memory cells is electrically connected to a corresponding bit line and selectively interconnected to a corresponding one of the complementary bit lines under control of a corresponding one of the word lines. Each of the plurality of magnetoresistive random-access memory cells includes a substrate; a sub-monolayer nitride layer, outward of the substrate, and having a sub-monolayer nitride layer thickness less than 10 Angstroms; and a templating layer, outward of the sub-monolayer nitride layer, including a binary alloy having an alternating layer lattice structure. A Heusler layer is located outward of the templating layer. The Heusler layer includes a Heusler compound and exhibits perpendicular magnetic anisotropy (PMA). A tunnel barrier is outward of the Heusler layer and a magnetic layer is outward of the tunnel barrier.

Optionally, the cells located at the plurality of cell locations can include, instead of or in addition to the cells with the sub-monolayer nitride layer, cells with the tantalum nitride layer, outward of the substrate, having a tantalum nitride layer thickness of 10 Angstroms±10%.

In a further aspect, a method of forming a magnetoresistive random-access memory cell includes providing a substrate; forming a sub-monolayer nitride layer, outward of the substrate, and having a sub-monolayer nitride layer thickness less than 10 Angstroms; providing a templating layer, outward of the interfacial nitride layer, and including a binary alloy having an alternating layer lattice structure; epitaxially growing a Heusler layer on the templating layer, the Heusler layer including a Heusler material; forming a tunnel barrier outward of the Heusler layer; and forming a magnetic layer outward of the tunnel barrier.

Optionally, the step of forming the sub-monolayer nitride layer can be substituted with a step of forming a tantalum nitride layer, outward of the substrate, having a tantalum nitride layer thickness of 10 Angstroms±10%.

In yet a further aspect, a hardware description language (HDL) design structure is encoded on a machine-readable data storage medium. The HDL design structure includes elements that when processed in a computer-aided design system generate a machine-executable representation of a magnetoresistive random-access memory cell and/or array, as described.

As used herein, "facilitating" an action includes performing the action, making the action easier, helping to carry the action out, or causing the action to be performed. Thus, by way of example and not limitation, instructions executing on one processor might facilitate an action carried out by semiconductor processing equipment, by sending appropriate data or commands to cause or aid the action to be performed. Where an actor facilitates an action by other than performing the action, the action is nevertheless performed by some entity or combination of entities.

Techniques as disclosed herein can provide substantial beneficial technical effects. Some embodiments may not have these potential advantages and these potential advantages are not necessarily required of all embodiments. By way of example only and without limitation, one or more embodiments may provide one or more of:

- MRAM devices where performance is improved (e.g., in terms of reducing or even eliminating intermediate states) with only a small loss in TMR by minimizing the number of grain boundaries via interfacial nitridation.
- MRAM devices where the cells exhibit low magnetization, and thus low switching current, via use of an ultrathin Heusler compound grown on a templating layer grown on a special interfacial nitride seed layer.
- MRAM devices where the magnetic layers of the cells exhibit volume perpendicular magnetic anisotropy (PMA), allowing scaling to small sizes than surface PMA, via use of an ultrathin Heusler compound grown on a templating layer grown on a special interfacial nitride seed layer.
- Fabrication techniques using an underlayer (e.g., CoAl) grown on a special interfacial nitride seed layer to permit epitaxial growth of an ultrathin Heusler compound.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIGS. 5B, 5C, and 6 show TMR obtained for various nitrides with a Cr overlying seed layer, according to aspects of the invention;

FIG. 13 presents a table of the effect on coercivity and TMR with $Mn_3Ge$ of alternate nitride dusting (interfacial) layers, according to aspects of the invention;

Figure 1:
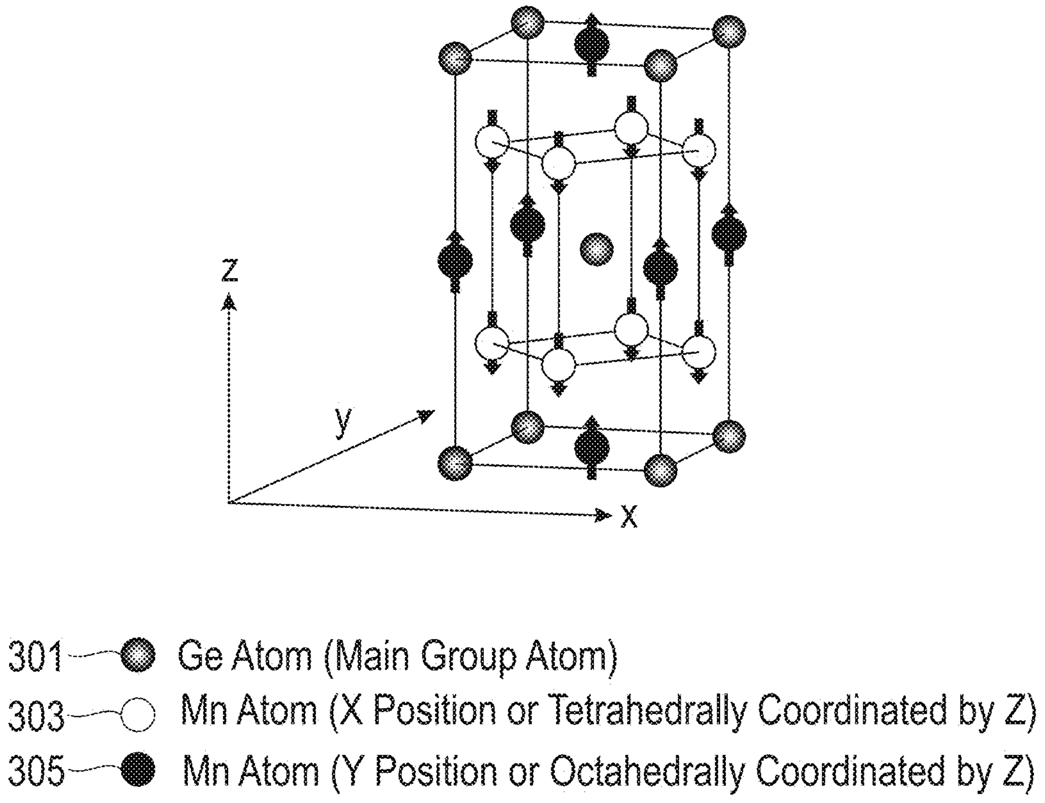
FIG. 1 shows a Heusler compound employed in aspects of the invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of inventions described herein will be in the context of illustrative embodiments. Moreover, it will become apparent to those skilled in the art given the teachings herein that numerous modifications can be made to the embodiments shown that are within the scope of the claims. That is, no limitations with respect to the embodiments shown and described herein are intended or should be inferred.

We have found that tetragonal Heusler compounds, which include $Mn_3Z$ with Z=Ge, Sn, and Sb, are of interest for MRAM applications, as they exhibit PMA, have low moment due to ferrimagnetic configuration, and exhibit large anisotropy. The composition can be, for example, $Mn_{3.3-x}Ge$, $Mn_{3.3-x}Sn$, and $Mn_{3.3-x}Sb$, with x being in the range from 0 to not more than 1.1. Alternatively, the Heusler compound may be a ternary Heusler, e.g., $Mn_{3.3-x}Co_{1.1-y}Sn$, in which x≤1.2 and y≤1.0. Alternatively, the Heusler compound is chosen from $Mn_2FeSb$, $Mn_2CoAl$, $Mn_2CoGe$, $Mn_2CoSi$, $Mn_2CuSi$, $Co_2CrAl$, $Co_2CrSi$, $Co_2MnSb$, and $Co_2MnSi$ (these compounds are listed with their nominal compositions; however, small variations (typically ≤±10%) from nominal composition of individual components within a Heusler compound should be possible).

In one or more embodiments, the thickness of the Heusler storage layer in an STT-MRAM application is ultrathin (~20 Å). Ternary systems may be a bit harder to grow than other systems. Half metallicity gives higher TMR (measure of change in resistance as device switches states).

Current MRAM devices use magnetic tunnel junction (MTJ) as a storage element. A simple MTJ is a tri-layer structure containing two magnetic layers separated by tunnel barrier layer. Current MTJs using Cobalt Iron Boron (Co/Fe/B) are able to provide magnetic layers which have magnetization perpendicular to the film surface (i.e. exhibit perpendicular magnetic anisotropy (PMA), which is desirable). The perpendicular magnetic anisotropy (PMA) of Co—Fe—B layers arises from the interfaces between these layers and the tunnel barrier and/or the underlayer on which the Co—Fe—B layer is deposited. Thus, these layers should be made sufficiently thin so that the interface PMA overcomes the demagnetization energy that arises from the magnetic volume and increases in proportion with the magnetic volume of the Co—Fe—B layer. However, their high moment requires a high switching current. One or more embodiments advantageously provide PMA due to volume anisotropy but with lower magnetic moment and thus reduced switching current compared to prior art devices.

It is desirable that magnetic materials have volume PMA rather than surface (interfacial) PMA, as this enables scaling of devices to smaller sizes (typically smaller diameter). As device size is reduced, the devices become less thermally stable. However, for devices with volume anisotropy, it is advantageously possible to compensate for the lowering of thermal stability by increasing the magnetic layer thickness. The switching current is proportional to the product ($M_s V H_k$) where $M_s$ is saturation magnetization, V is volume, and $H_k$ is the anisotropy field. Low moment (i.e., low $M_s$) Heusler compounds need lower switching currents than high moment materials (such as CoFe alloys) with the same thermal energy barrier, unless the increase in $H_k$ overwhelms the lower $M_s$.

Thus, for MRAM applications, it is desirable that all the magnetic elements have their moments perpendicular to the layer itself (i.e., magnetization perpendicular to the film plane—PMA arising from the crystalline structure). Low magnetization and low switching currents are desirable. Additionally, it is desirable that the MTJ devices have bistable switching states, i.e., the entire magnetic volume of the MTJ device switches between its parallel and anti-parallel states in single transitions.

Typically, Heusler compounds tend to be cubic. Thus, a thin film is grown, and the magnetic moment will be in the plane of the layer. For an MTJ for MRAM applications, it is highly desirable for the magnetic moments of the magnetic layer to be perpendicular to the layer.

One or more embodiments advantageously make half metallic Heusler compounds tetragonal with non-zero anisotropy by using an underlayer (e.g., CoAl) with a different in-plane lattice constant (as compared to the cubic form), which is itself grown on an interfacial nitride layer, obtaining volume anisotropy as opposed to interfacial anisotropy. In one or more embodiments, the Heusler material can be the bottom electrode of the MRAM cell. On the other hand, in one or more embodiments, the Heusler compound can be the top electrode of the MRAM cell. Generally, the phrase "interfacial nitride layer" can be used describe a layer with thickness of a sub-monolayer. Typically, a monolayer has a thickness of ~2 Å and for an interfacial layer we refer to a thickness of <2 Å. Stated in an alternative manner, one or more embodiments employ sub-monolayer thick nitride. There is one exception which is TaN with a nominal thickness of 10 Å (see FIG. 13).

One or more embodiments make use of a templating layer (in a non-limiting example, a chemical templating layer (CTL)). Referring to FIG. 1 consider now aspects of an exemplary chemical templating layer. A Heusler compound such as $Mn_3Ge$ (alternately $Mn_3Sn$ or $Mn_3Sb$) includes alternating layers of Mn—Mn and Mn—Ge atoms. In FIG. 1, atoms with shading 301 represent Ge atoms (main group), atoms with shading 303 represent Mn atoms of the X-position in $X_2YZ$ (tetrahedrally coordinated by Z), and atoms with shading 305 represent element Mn atoms of the Y-position in $X_2YZ$ (octahedrally coordinated by Z). Mn is a transition metal and Ge is from the main group of the periodic table. One of the alternating layers contains transition metal atoms 303 only and other contains main group element atoms 301 along with transition metal atoms 305. Thus, a seed layer containing a single element which lattice-matches the in-plane lattice constant does not promote growth of an ordered Heusler compound at low temperatures such as room temperature. An ideal seed layer includes a binary compound of a transition element and a main group element. Moreover, this ideal seed layer also has an alternating layer structure containing these two distinct elements. One layer has only the transition metal. The other layer has only the main group element (the "Z" in $X_2YZ$ is a main group element as well). These binary compounds have a CsCl-like (cesium chloride-like) structure (where each cesium ion is coordinated by eight chloride ions). Exemplary templating layers include CoAl, CoGa, and the like.

Referring to the crystal structure in FIG. 1, all 3 axes are not the same; dimensions a and b (not labelled in the figure, along the x and y axes) are the same in the depicted example, while dimension c (not labelled in the figure, along the vertical z axis) is different. Note the magnetization arrows going up and down along z. Stretching of crystals in the z direction yields volume anisotropy. Note the alternating layer structure. Use of a seed layer with alternating layer structure containing two distinct elements (one transition metal and other main group element) allows room-temperature growth.

Figure 2:
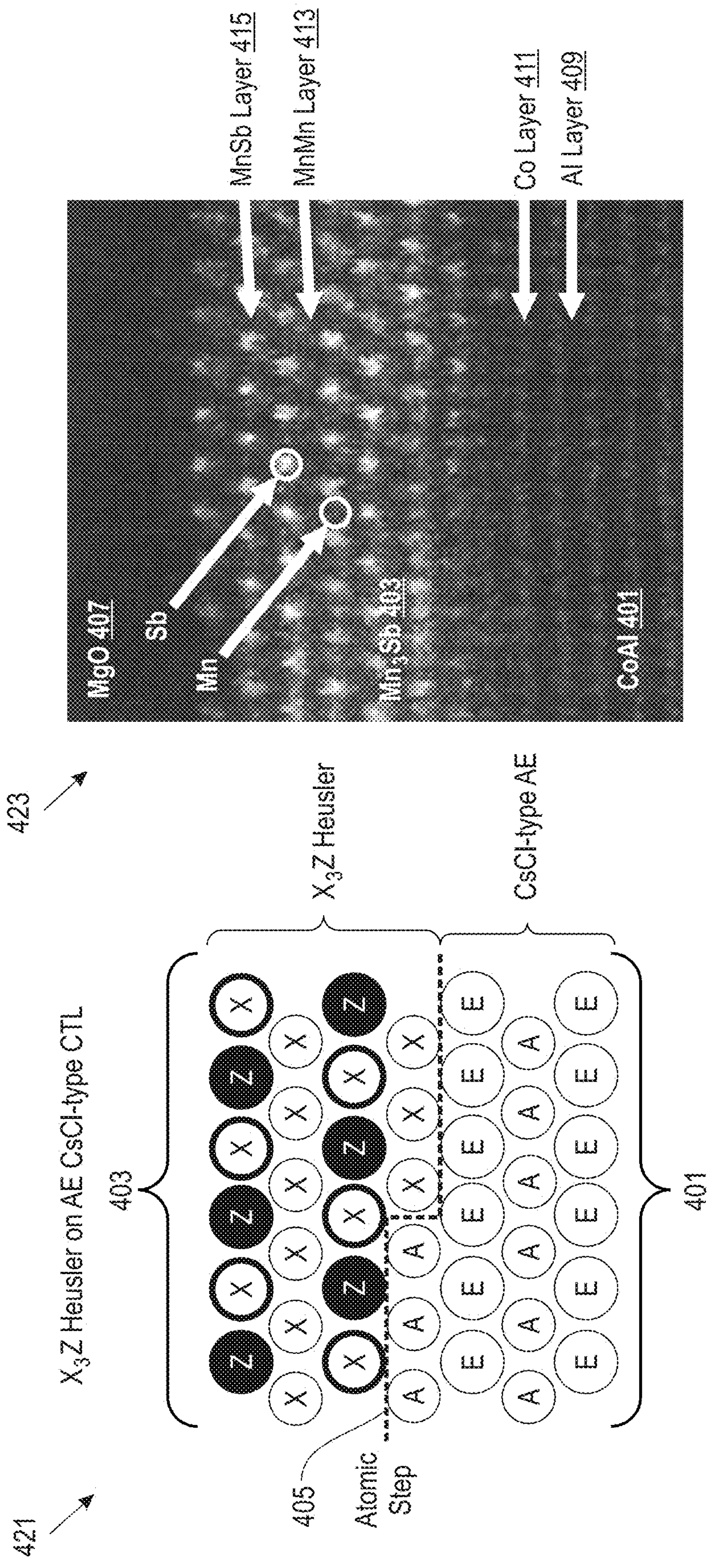
FIG. 2 shows growth of a Heusler compound on a templating layer according to aspects of the invention.

Referring now to FIG. 2, one or more embodiments employ a CsCl-type chemical templating layer (CTL) 401 (CoAl is an example of an excellent CsCl-type CTL) which promotes growth of an ordered Heusler compound even at ultrathin thicknesses and at room temperature. "E" can correspond, for example, to Al and "A" can correspond, for example, to Co. In FIG. 2, view 421 is a schematic while view 423 is a transmission electron microscopy (TEM) image. A Heusler compound such as $Mn_3Ge$ or $Mn_3Sn$ or $Mn_3Sb$ 403 grows epitaxially on top of the CoAl layer 401. We have found that even ternary Heusler compounds can be ordered by the CTL. Indeed, we have found that it is pertinent in one or more embodiments that the CoAl has (001) texture, implying the requirement for a seed layer underlying the CoAl which promotes such growth. Currently, preferred seed layers include metallic $Mn_xN$ or semiconducting $Sc_xN$ which promotes the (001) texture in CoAl on Si substrates. Note, with regard to $Mn_xN$ and $Sc_xN$, in one or more embodiments, for $Mn_xN$ $2.5 \leq x \leq 4.5$ and for $Sc_xN$ $0.8 \leq x \leq 1.2$.

The in-plane lattice constant of the ultrathin (<~25 Å) Heusler compound is similar to that of the CoAl CTL. It is possible to strain the Heusler to a differing extent with an appropriate choice of CTL. We have found that even ternary Heusler compounds can be ordered by the CTL. As illustrated, the Mn (generally, X) grows on the Al and the Sb (generally, Z) grows on the Co. Note the atomic step 405. The Heusler material can be strained and thus adopts the in-plane lattice constant of the template material. One or more embodiments impose the lattice constant of the templating layer onto the Heusler layer. In view 423, note that CoAl 401 includes Al layers 409 and Co layers 411 and the $Mn_3Sb$ 403 includes MnMn layer 413 and MnSb layer 415. Note the MgO tunnel barrier 407. The three most prominent tetragonal compounds are $Mn_3Ge$, $Mn_3Sn$, and $Mn_3Sb$, and $Mn_3Sb$ has a larger difference in atomic number between Mn and Sb and thus is easier to see in the TEM image 423.

Figure 3:
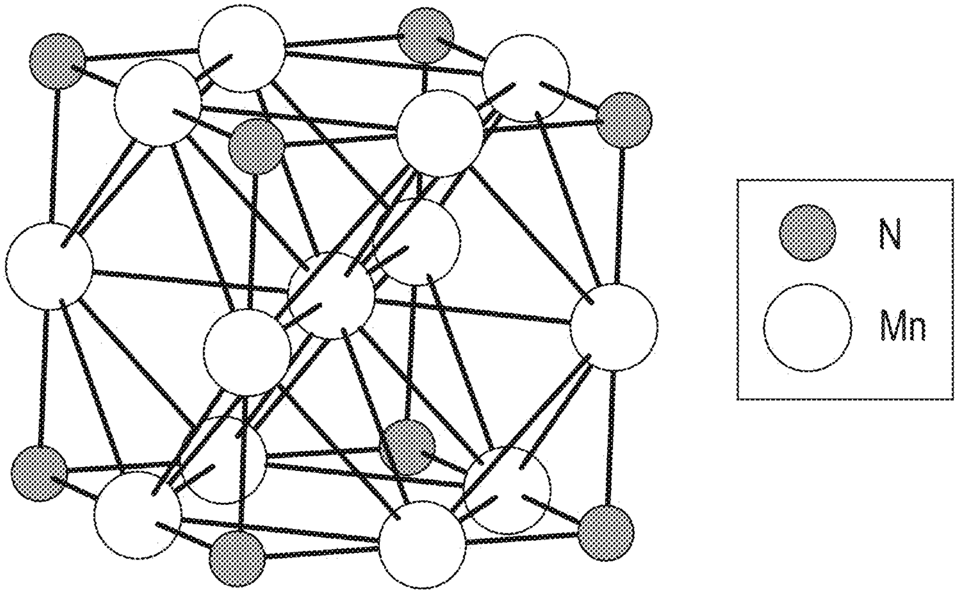
FIG. 3 shows the chemical structure of $Mn_4N$, useful in connection with aspects of the invention.

Referring to FIG. 3, consider $Mn_xN$ as a seed layer for promoting CTL growth on Si substrates. $Mn_4N$ is a metallic compound with a cubic crystal structure ($Fe_4N$ prototype). $Mn_4N$ has a lattice constant of about 3.87 Å. The lattice mismatch between CoAl (2.86 Å) and $Mn_4N$ is ~4% (after 45° in-plane rotation). $Mn_4N$ is chemically ordered with alternating layers of MnMn and MnN. Known $Mn_xN$ phases from the literature are MnN, $Mn_{1.5}N$, $Mn_2N$, $Mn_{2.3}N$, and $Mn_4N$.

Figure 4:
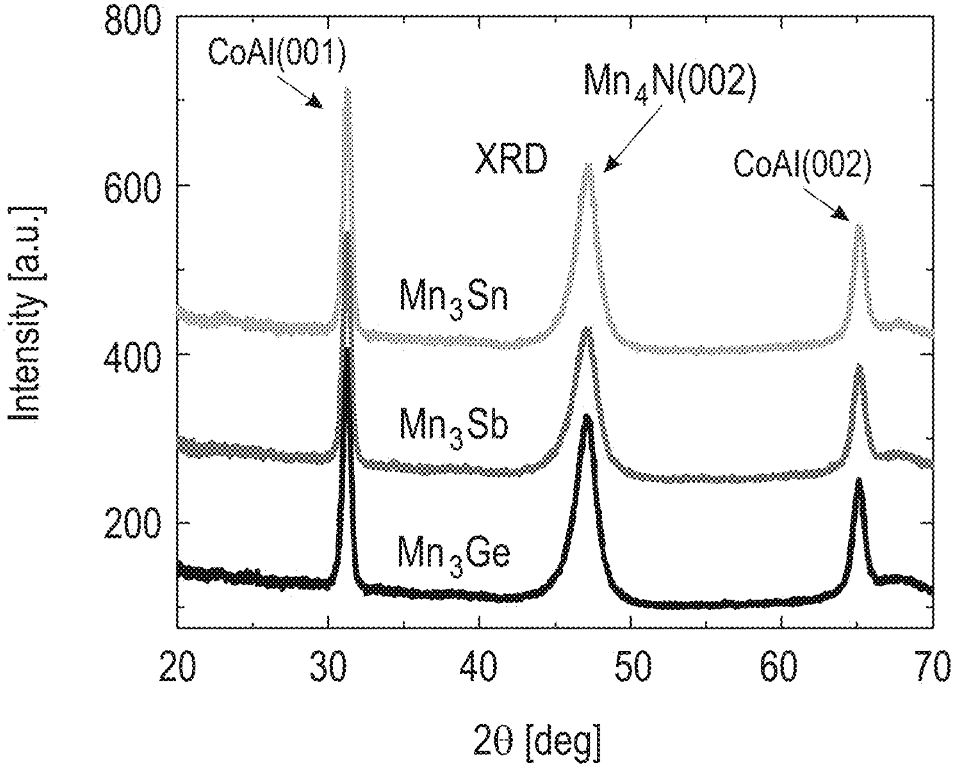
FIG. 4 shows X-Ray Diffraction (XRD) results demonstrating how $Mn_xN$ promotes layered structure growth in a CoAl templating layer, useful in connection with aspects of the invention.

$Mn_xN$ promotes layered structure growth on a CoAl CTL. FIG. 4 shows X-Ray diffraction (XRD) results, intensity in arbitrary units versus 2 theta. The test stacks were built on a silicon wafer, followed by $SiO_2$, a 50 Å tantalum layer, a 3 Å CoFeB layer, a 300 Å nitride (e.g., $Mn_4N$) layer, 300 Å CoAl in an alternating layer structure, then 10 Å $Mn_3Z$ (Z can be Ge, Sb, or Sn), then 20 Å of MgO and 20 Å of Ta. The 300 Å interfacial layer of $Mn_4N$ is pertinent in one or more embodiments. All layers were deposited at room temperature. The $Mn_3Ge$ was grown using ion beam deposition (IBD), while the $Mn_3Sb$ and $Mn_3Sn$ were grown using a magnetron turret (single targets). Note the peaks for CoAl (001), $Mn_4N$ (002), and CoAl (002).

For all 3 films, both $Mn_4N$ and CoAl layers show highly textured (001) crystal orientation. It can thus be seen that room temperature deposition of an $Mn_4N$ underlayer promotes the requisite structure and orientation of the CoAl CTL. Note that the X-ray diffraction (XRD) peaks assigned in FIG. 4 correspond to $Mn_4N$ (002) but when film texture is described, typically, the lowest crystal plane is used, which in this case is (001).

Accordingly, one or more embodiments provide a nitride seed layer that facilitates the requisite texture in the chemical templating layers. Chemical templating layers (CTL) promote the growth of ordered ultrathin Heusler compounds even at room temperature (i.e. without any additional annealing). The effective/reliable CTLs contain Al from the main group of the periodic table (e.g. CoAl, IrAl, RuAl, etc.). In one or more embodiments, the CTL should have a (001) orientation to induce perpendicular magnetic anisotropy (PMA) in the Heusler compound. The CTLs have an alternating layer structure. We have found that growth of (001) textured CoAl films on Si substrates can be accomplished with a special seed layer. We have found suitable materials which are electrically conducting in the form of a nitride seed layer including $Mn_xN$ or $Sc_xN$, which reliably promotes (001) textured growth for qualified chemical templating layers.

Indeed, we have identified suitable replacements for $Mn_xN$ or $Sc_xN$ seed layers, wherein the replacement material is an ultrathin (sub-monolayer thick) or interfacial modification of the layer underlying the chemical templating layer. This layer is expected to be highly thermally stable, and has been found to promote the requisite texture in the chemical templating layer. Advantageously, there is no significant MTJ performance penalty (i.e., the TMR of the MTJ stack with $Mn_xN$ or $Sc_xN$ is matched). Further, one or more embodiments advantageously simplify the MTJ stack, as in some instances, there is no need for a specific nitride material. Furthermore in this regard, the table of FIG. 13 shows sub-monolayer thick nitride layers of several different materials. Amongst them are Ti, Ta, and Cr. Ti and Ta are utilized in MRAM stacks for other reasons; thus, if using Ti or Ta nitride then it is not necessary to include an Mn or Sc target within the deposition tool. Note that Mn or Sc targets have only one function, which is to deposit the sub-monolayer nitride. It is worth noting that heretofore, thick nitride layers, on the order of 300 Å, have been employed. In contrast, one or more embodiments use an ultrathin (typically sub-monolayer thick <2 Å with the exception of TaN which, as per the second TaN example in the table of FIG. 13, can, in some instances, be about 10 Å thick (10 Å±10%) interfacial layer, and provide improved MTJ performance.

Figure 5A:
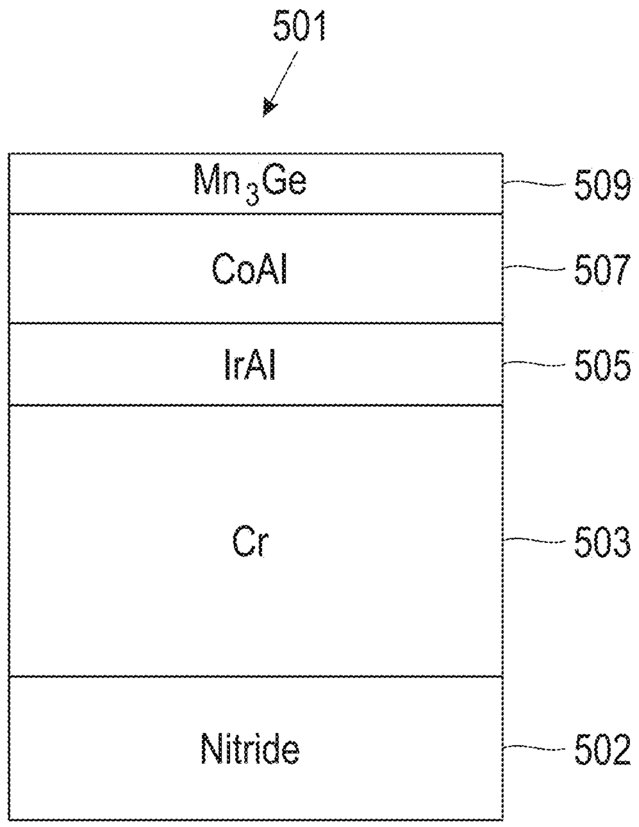
FIG. 5A shows a material stack underneath a tunnel barrier according to aspects of the invention.
Figure 5B:
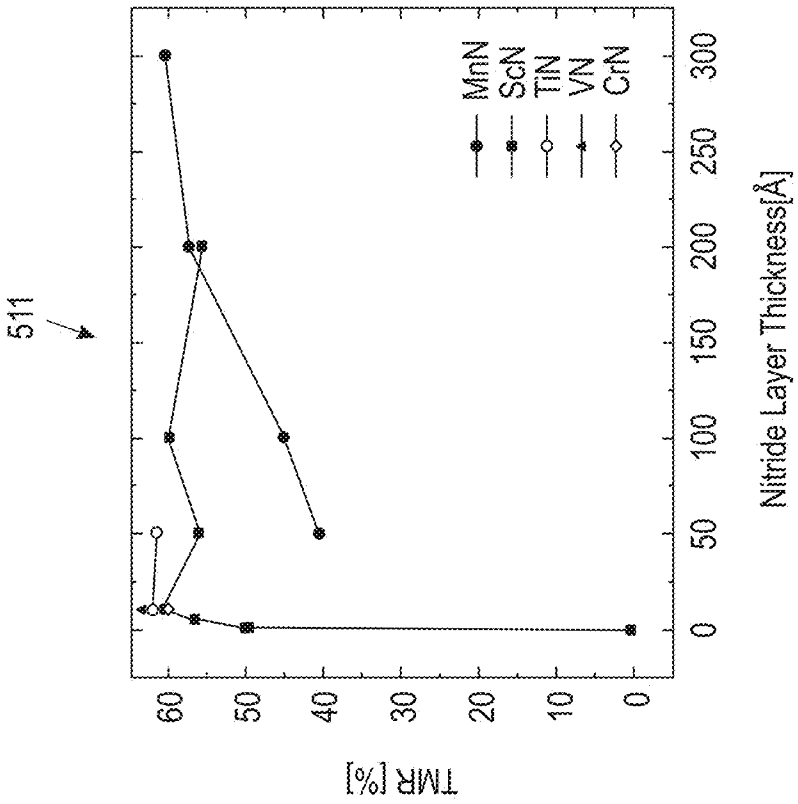
Figure 5C:
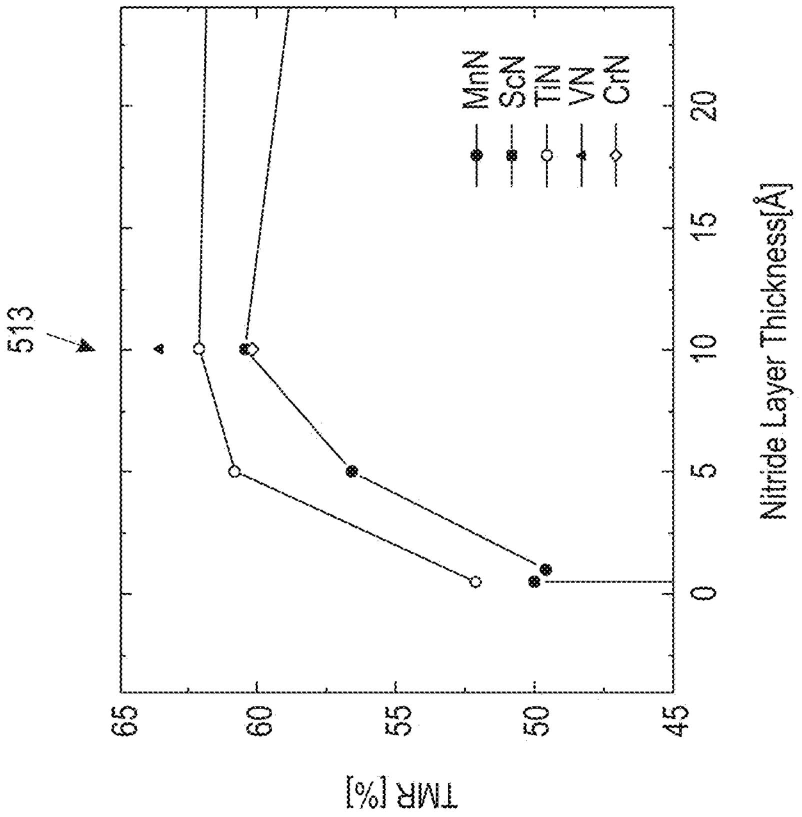

FIG. 5A shows a material stack underneath a tunnel barrier according to aspects of the invention, and FIGS. 5B, 5C, and 6 show TMR obtained for various nitrides with a Cr overlying seed layer, according to aspects of the invention. The stack 501 includes nitride 502, Cr 503, IrAl 505, CoAl templating layer 507, and $Mn_3Ge$ 509. Graph 511 shows the TMR (%) versus nitride layer thickness (in Angstroms) for MnN, $Sc_xN$, TiN, VN, and CrN, over a thickness range of 0-300 Angstroms. Graph 513 shows detail of the TMR (%) versus nitride layer thickness (in Angstroms) for MnN, $Sc_xN$, TiN, VN, and CrN, over a thickness range of 0-20 Angstroms. The graphs are for an exemplary stack including 50 Å Ta (not shown in 501), 5 Å CoFeB (not shown in 501), t (i.e., plotted variable thickness) Å Nitride 502, 400 Å Cr 503, 50 Å IrAl 505, 150 Å CoAl 507, 15 to 19 Å $Mn_3Ge$ 509, ~14 Å MgO (not shown in 501), 13.5 Å CoFeB (not shown in 501), 50 Å Ta (not shown in 501), and 100 Å Ru (not shown in 501).

Figure 16:
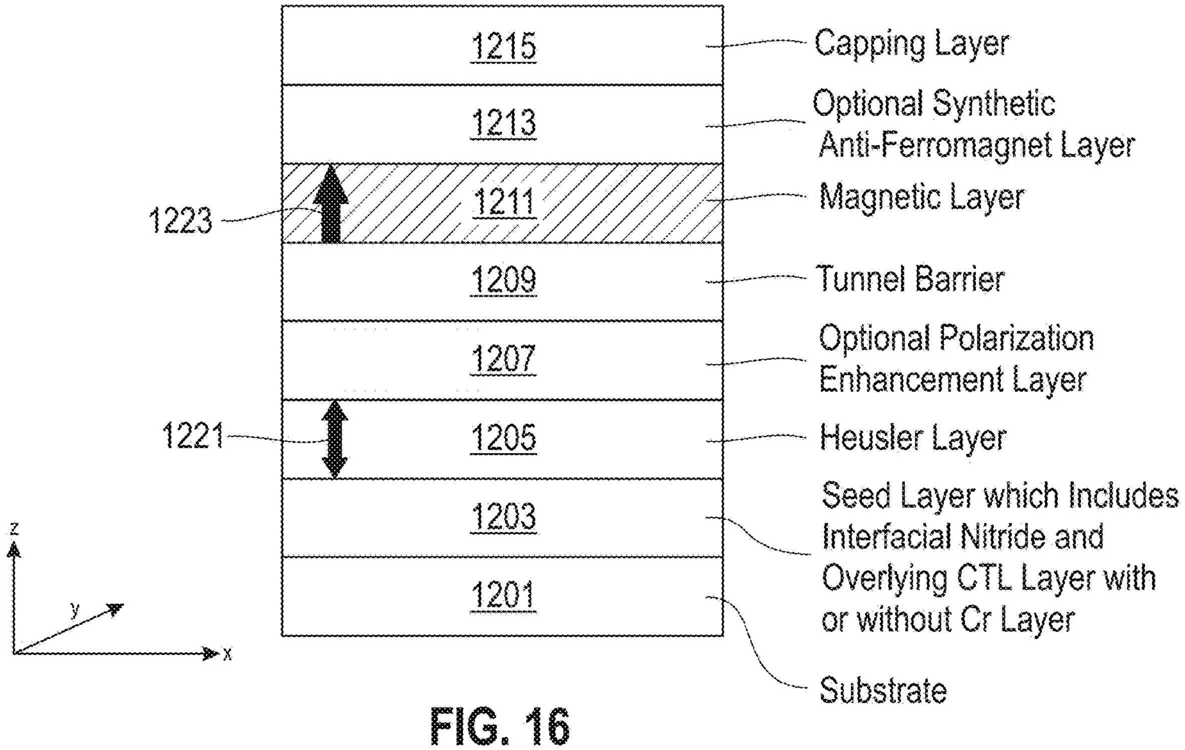
FIG. 16 shows a first exemplary MRAM cell, according to an aspect of the invention.
Figure 17:
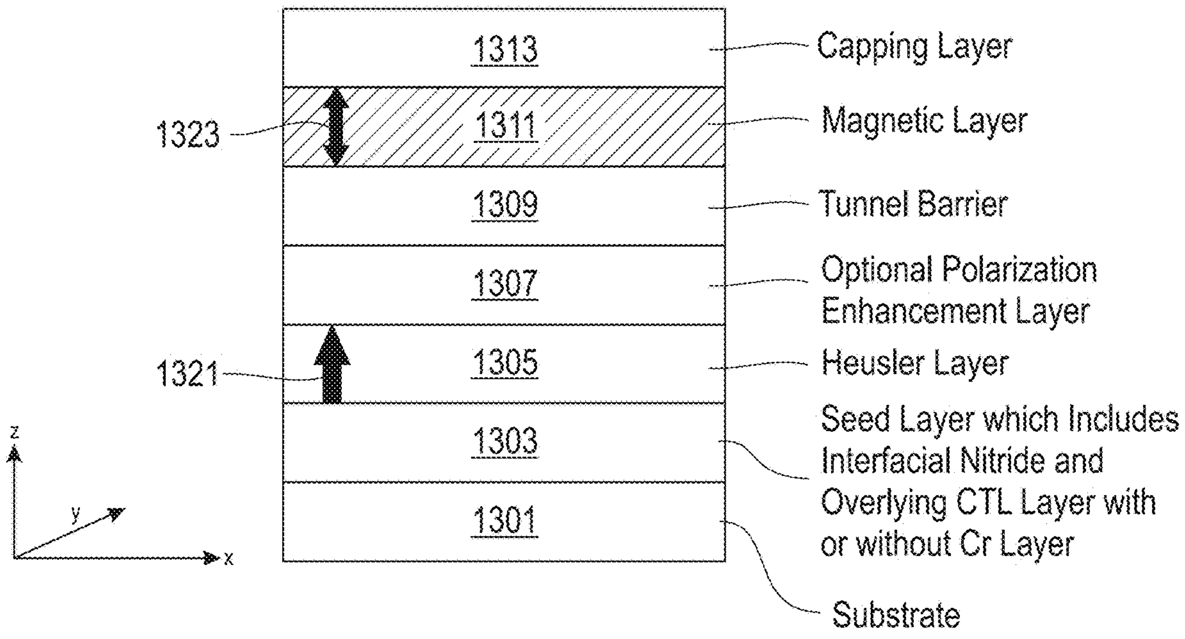
FIG. 17 shows a second exemplary MRAM cell, according to an aspect of the invention.

Advantageously, CrN, VN, TiN, and $Sc_xN$ promote the requisite texture within the overlying chromium/chemical templating layer. The TMR of $Mn_3Ge$ stacks is similar (~60%) to each other for nitride thickness of 10 Å. The TMR of $Mn_3Ge$ stacks is similar (~50%) to each other for the ultrathin nitride thicknesses <2 Å (sub-monolayer thickness regime). The TMR of the $Mn_3Ge$ stack is 0% with no nitride layer. A nitride layer is referred to as "interfacial" or "sub-monolayer" or "dusting" herein when it is not a complete nitride layer, i.e., it is not even a monolayer. In one or more embodiments, the MTJ stack is grown on a Si substrate with amorphous underlayers. Note the nitride layer 502, chromium conducting layer 503, templating layer 507, and Heusler compound of choice 509. Referring to FIGS. 16 and 17, one or more embodiments include a tunnel barrier 1209, 1309, a CoFeB layer such as 1211, 1311, and a capping layer 1215, 1313 of, for example, tantalum and/or ruthenium. As seen in views 511, 513, except for MnN, it is possible to reduce thickness down to around 10 Å with no penalty in TMR. Even at 1 Å, while some TMR is lost, there are other benefits such as highly smooth films with minimal interdiffusion of materials which lead to superior switching performance of MTJ devices. As used herein, including the claims, "a sub-monolayer nitride layer . . . having a sub-monolayer nitride layer thickness less than 10 Angstroms" refers to a layer that is both less than 10 Angstroms in thickness and also a sub-monolayer; i.e., the amount of nitride is less than the amount that would be present in a monolayer.

Referring to the table of FIG. 6, surprisingly, despite large variation in lattice constant amongst CrN, VN, TiN, and $Sc_xN$, the TMR is similar. This suggests that the role of these nitrides is interfacial surface modification rather than structural epitaxy of the subsequent layers. Even a 0.5 Å $Sc_xN$ or TiN layer provides TMR of 50%; however, TMR with no nitride layer is 0%. Further comments are appropriate on the thickness of the nitride layers. When material is deposited, typically, a shutter is opened and there is a scandium target present. Argon and nitrogen are provided in the gaseous phase. During sputtering, the scandium is transferred from the target to the substrate. Some of the nitrogen atoms are incorporated into the film to form scandium nitride. A growth rate can be measured, such as growing ½ Angstrom per second. This can be determined by growing a film with a detectable thickness (say, 100 Angstroms) (measure, e.g., with a profilometer) and dividing by the time it takes to grow (say 200 seconds so 12 Angstrom per second). To grow "1 Angstrom," keep the shutter open for 2 seconds; to grow 10 Angstroms, open for 20 seconds; etc. A thin layer, less than a monolayer, can be discontinuous (i.e., a monolayer with holes) or sparse (scandium/nitrogen reacting with or undergoing adsorption onto the layer underneath). Thus, the terminology "interfacial or dusting layer." Note, as used herein, including the claims, a "sub-monolayer nitride layer" is intended to define a layer having a sub-monolayer thickness on average, and to include both discontinuous such layers (i.e., having local monolayer thickness and holes) and layers with reaction/adsorption.

Figure 7:
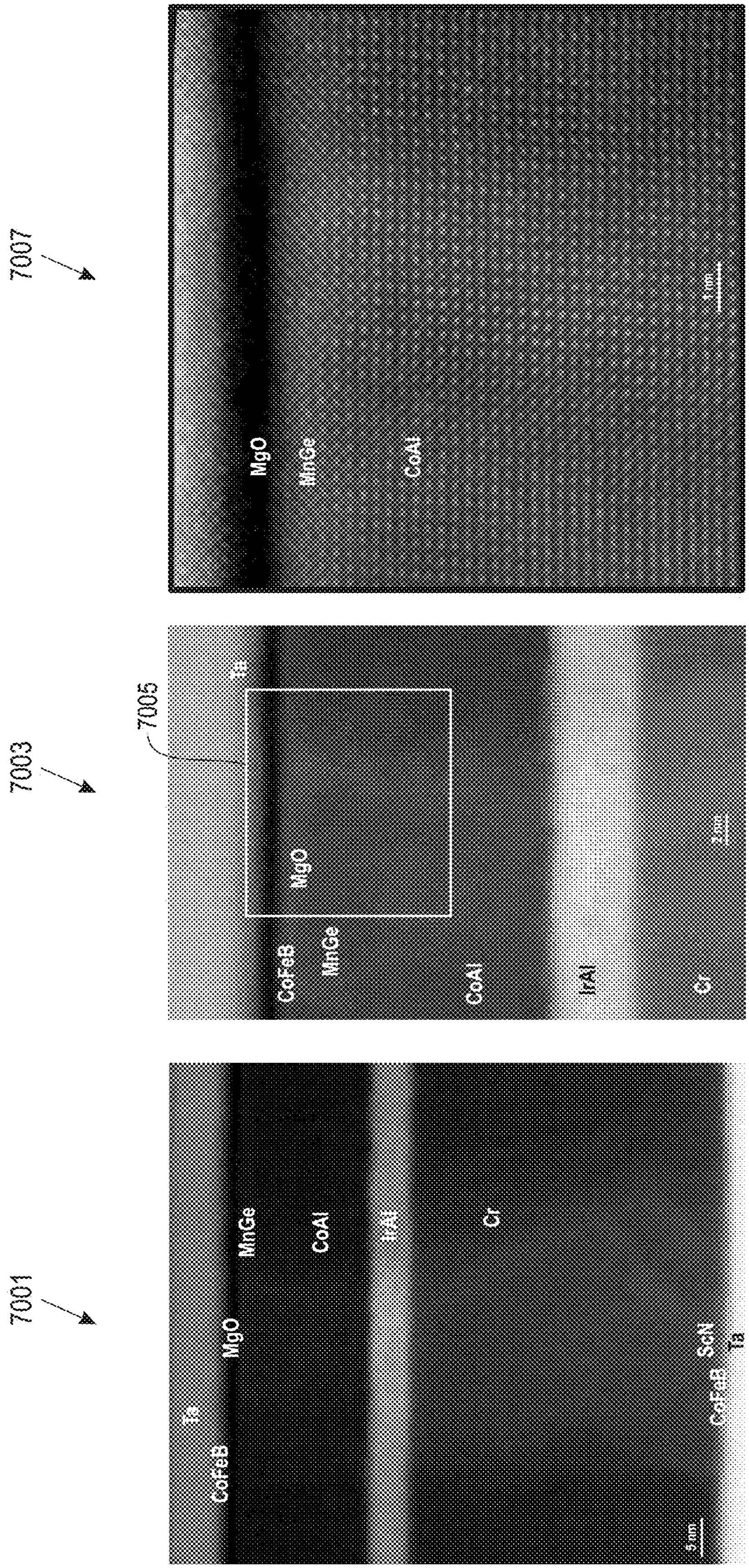
FIG. 7 presents Transmission Electron Microscope (TEM) images of a sample with 0.5 Å of interfacial $Sc_xN$ layer, according to aspects of the invention.

FIG. 7 shows transmission electron microscopy (TEM) of a sample with t=0.5 Å of an interfacial $Sc_xN$ layer. The TEM images indicate a high level of structural ordering and epitaxial growth, even with the interfacial nitride layer on Si substrates. The 0.5 Å $Sc_xN$ layer is not visible within TEM image as it is below TEM detection limit. View 7001 has a scale where 5 nm corresponds to the indicated length; view 7003 has greater magnification with a scale where 2 nm corresponds to the indicated length; and view 7007 has the greatest magnification corresponding to region 7005 in view 7003, with a scale where 1 nm corresponds to the indicated length. In view 7007, the CoAl is nicely ordered, and the $Mn_3Ge$ (indicated as MnGe within the TEM images) is also pretty well ordered. The MgO is also well ordered, and while hard to see in this image, could be brought out with a different contrast. The CoFeB is also well-ordered, and good TMR can be obtained.

Figure 8:
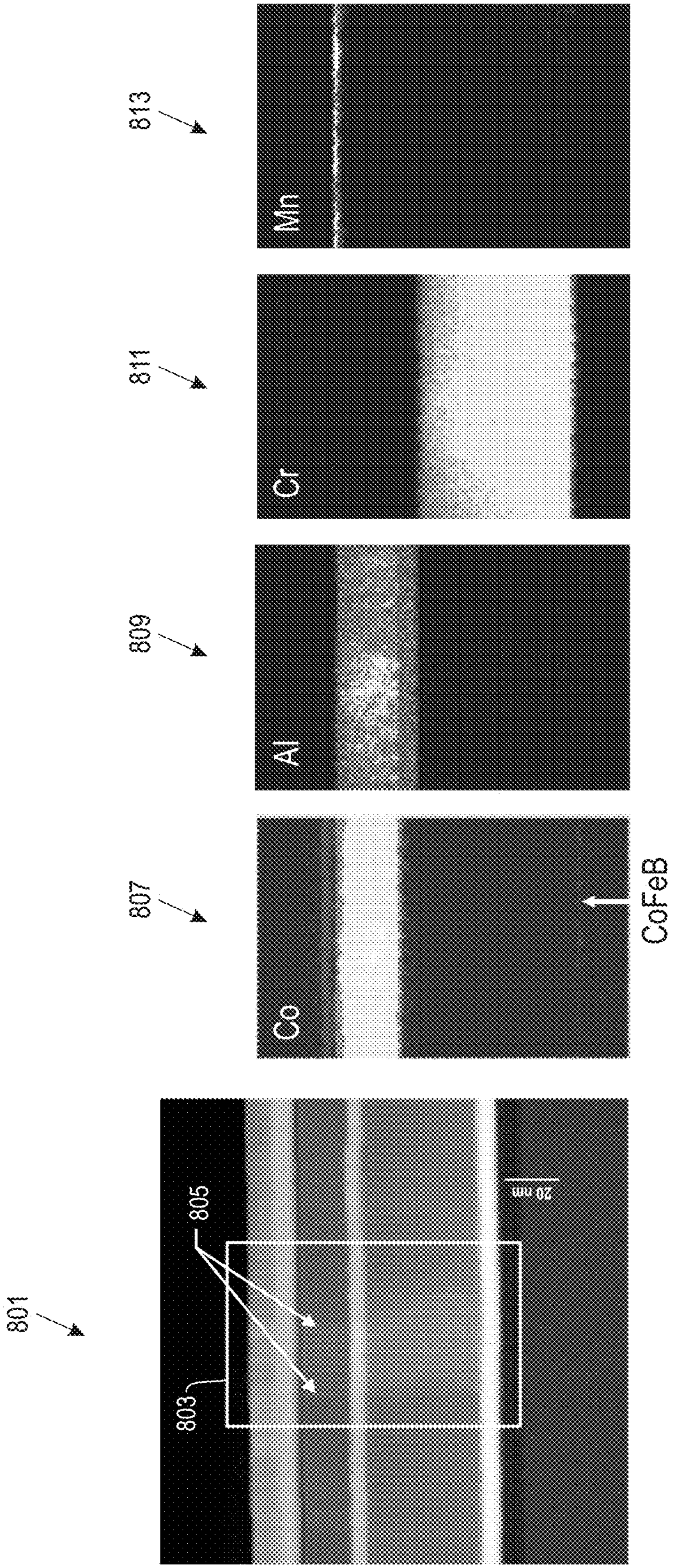
FIG. 8 presents an electron energy loss spectroscopy (EELS) heat maps of the sample with 0.5 Å of interfacial $Sc_xN$ layer and $Mn_3Ge$ Heusler layer, according to aspects of the invention.

FIG. 8 shows electron energy loss spectroscopy (EELS) heat maps of the sample of FIG. 7. The EELS heat maps were obtained from an ~60 nm region indicated by the box 803 in view 801, which indicates no Mn diffusion along the observed grain boundaries 805. This provides an indication that use of interfacial nitridation is a pathway to reduction of Mn diffusion from an $Mn_3Ge$ layer with stacks on Si substrates. View 807 shows Co, which is present in the CoAl and CoFeB layers; view 809 shows Al; view 811 shows Cr; and view 813 shows Mn. One pertinent advantage of using the interfacial $Sc_xN$ layer is that though grain boundaries are noted yet diffusion is reduced. We have found that an ultra-thin nitride layer advantageously reduces the number of grain boundaries and for some of the grain boundaries, there is no diffusion.

Figure 9:
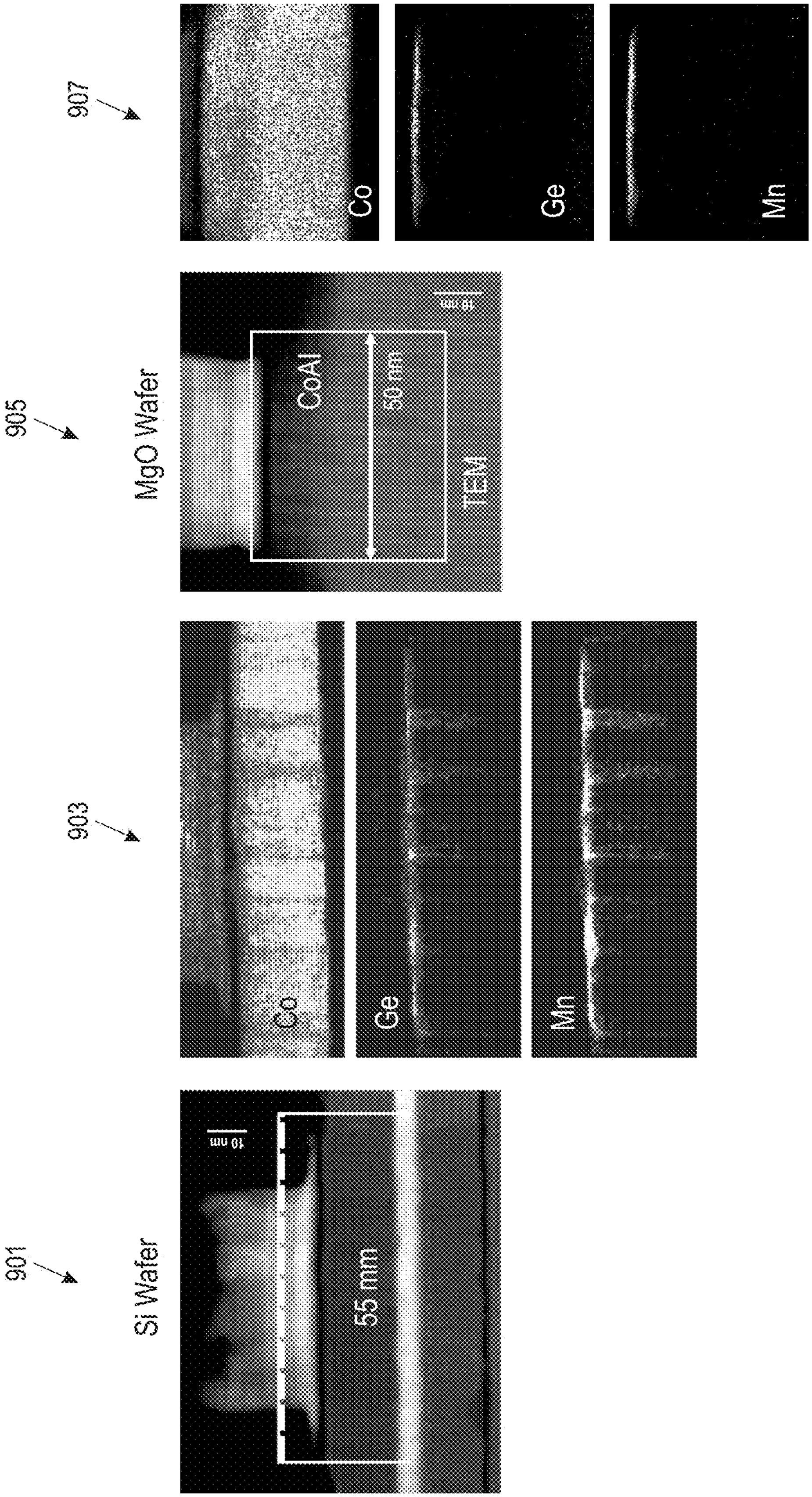
FIG. 9 presents a TEM-EELS analysis of an $Mn_3Ge$ device on MgO vs. Si, according to aspects of the invention.

FIG. 9 uses a TEM-EELS analysis to compare an $Mn_3Ge$ device on MgO vs. Si. Views 901, 903 are for a 55 nm device built on a silicon wafer, with a stack of Si substrate, 50 Å Ta, 250 Å Ru, 100 Å Ta, 5 Å $(CoFe)_{80}B_{30}$, 200 Å $Mn_xN$, 4 Å MgO, 150 Å CoAl, 50 Å IrAl, 150 Å CoAl, 20.5 Å $Mn_3Ge$ annealed at about 340 degrees C. (note that 200 Å $Mn_xN$ is "not interfacial"), 12.5 Å MgO, 6 Å $(CoFe)_{70}B_{30}$-6.5 Å $(CoFe)_{80}B_{20}$, 2.9 Å Ta, and Synthetic anti-ferromagnet (SAF). In view 903, note the views for EELS heat maps for Co, Ge, and Mn, with diffusion of the Mn and Ge into the CoAl layer is visible. On the other hand, views 905, 907 are for the device built on an MgO wafer, with a stack of MgO (001) substrate, 20 Å MgO, 400 Å Cr, 200 Å VN, 300 Å CoAl, 11 Å $Mn_3Ge$ annealed at about 340 degrees C., 10.3 Å MgO, 6 Å $(CoFe)_{70}B_{30}$-7.5 Å $(CoFe)_{80}B_{20}$, 2.8 Å Ta, and SAF. In view 903, the streaks going down along the grain boundaries will impact the device properties. In view 907, note the views for Co, Ge, and Mn, with no interdiffusion, fewer grain boundaries, and better electrical properties for the device. The presence of significant diffusion of Mn from the $Mn_3Ge$ layer on Si-based MTJs, and its lack on MgO substrates, was verified by multiple TEM-EELS (the EELS sampling region was ~50 to 55 nm). To mimic this on an amorphous substrate, the interfacial $Sc_xN$ of FIG. 8 can be employed.

Generally, we have found that an interfacial nitride layer minimizes diffusion along grain boundaries.

Figure 10:
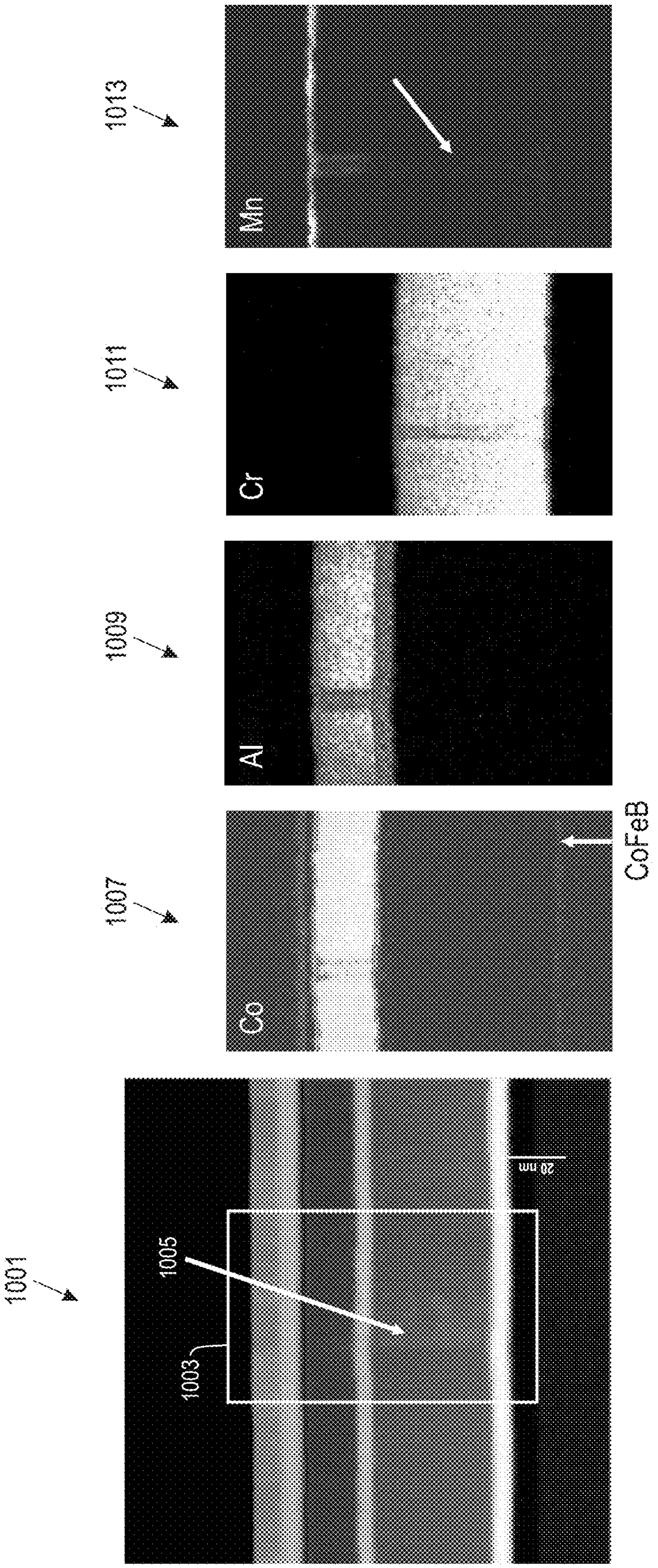
FIG. 10 presents another EELS heat maps of the sample with 0.5 Å of interfacial $Sc_xN$ layer, according to aspects of the invention.

FIG. 10 shows an electron energy loss spectroscopy (EELS) heat maps of another sample (different region of the same sample as FIG. 8) with t=0.5 Å of interfacial $Sc_xN$ layer. The EELS heat maps were obtained from an ~60 nm region indicated by the box 1003 in view 1001, which indicates Mn diffusion along the observed grain boundaries 1005. This provides an indication that use of interfacial nitridation is a pathway to reduction of Mn diffusion from an $Mn_3Ge$ layer with stacks on Si substrates. It appears that there are multiple types of grain boundaries within the sample. Dependent on their type or origin, Mn diffusion is present or absent. Nevertheless, there are regions of significant lateral size which are diffusion free on Si substrates. View 1007 shows Co which is present in CoAl and CoFeB; view 1009 shows Al; view 1011 shows Cr; and view 1013 shows Mn.

Figure 11:
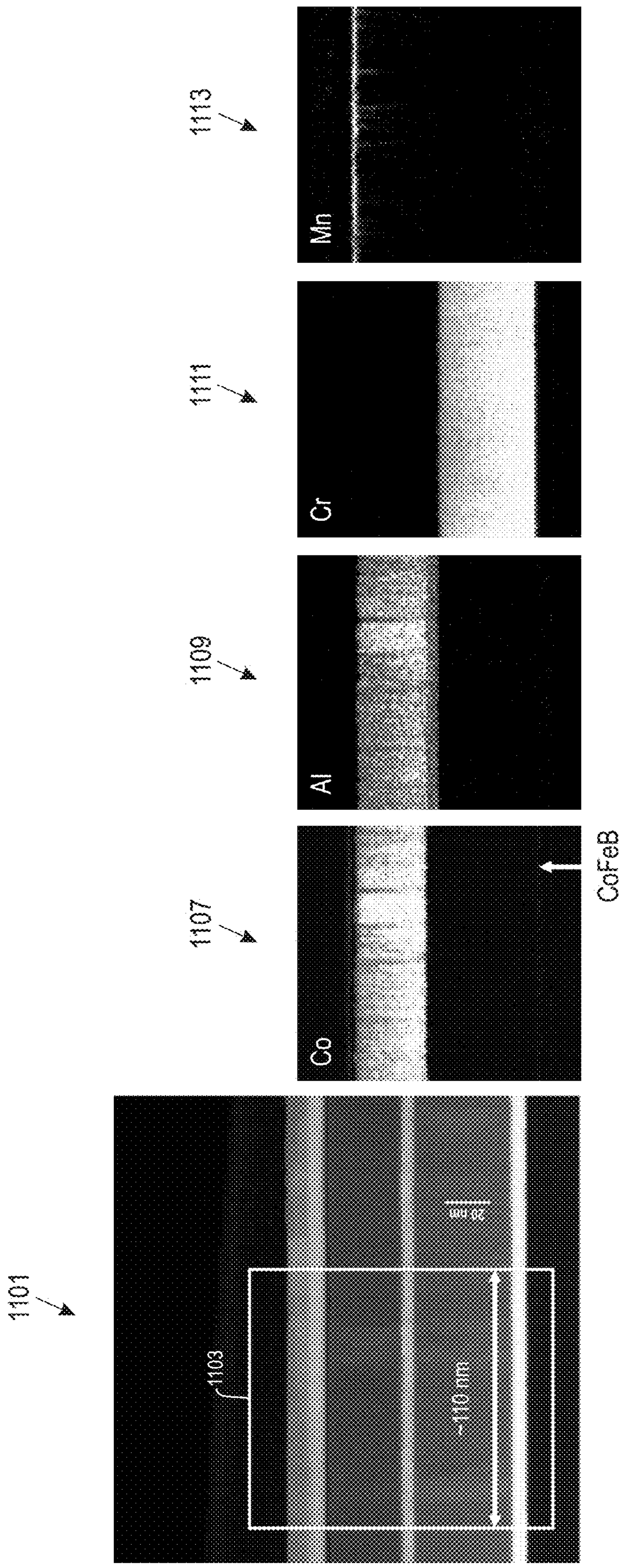
FIG. 11 presents an EELS heat maps of a sample with 0.5 Å of interfacial $Sc_xN$ layer, according to aspects of the invention.

FIG. 11 shows an electron energy loss spectroscopy (EELS) heat maps of another sample with t=5 Å of interfacial $Sc_xN$ layer. The EELS heat maps were obtained from ~110 nm region indicated by the box 1103 in view 1101. In contrast to the sample with 0.5 Å $Sc_xN$ dusting/interfacial layer, many more grain boundaries (9-13) are observed. Thus, use of a nitride layer with even 5 Å thickness leads to formation of far more grain boundaries than in the 0.5 Å case. Significantly more Mn diffusion from the $Mn_3Ge$ layer occurs along the grain boundaries. View 1107 shows Co which is present in CoAl and CoFeB; view 1109 shows Al; view 1111 shows Cr; and view 1113 shows Mn. Using a 5 Å

$Sc_xN$ layer thus causes more grain boundaries than the 0.5 Å layer and consequently more interdiffusion along the grain boundaries.

Figure 12A:
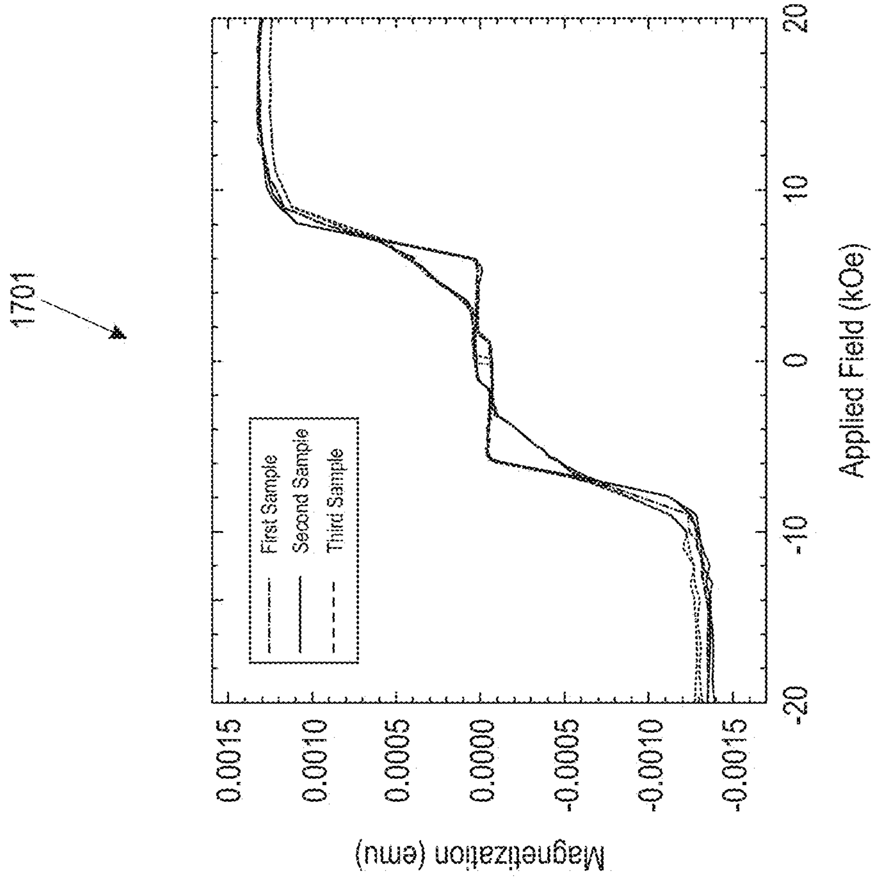
FIGS. 12A and 12B show the influence of the thickness of $Sc_xN$ on magnetization and coercivity of the $Mn_3Ge$ layer, according to aspects of the invention.
Figure 12B:
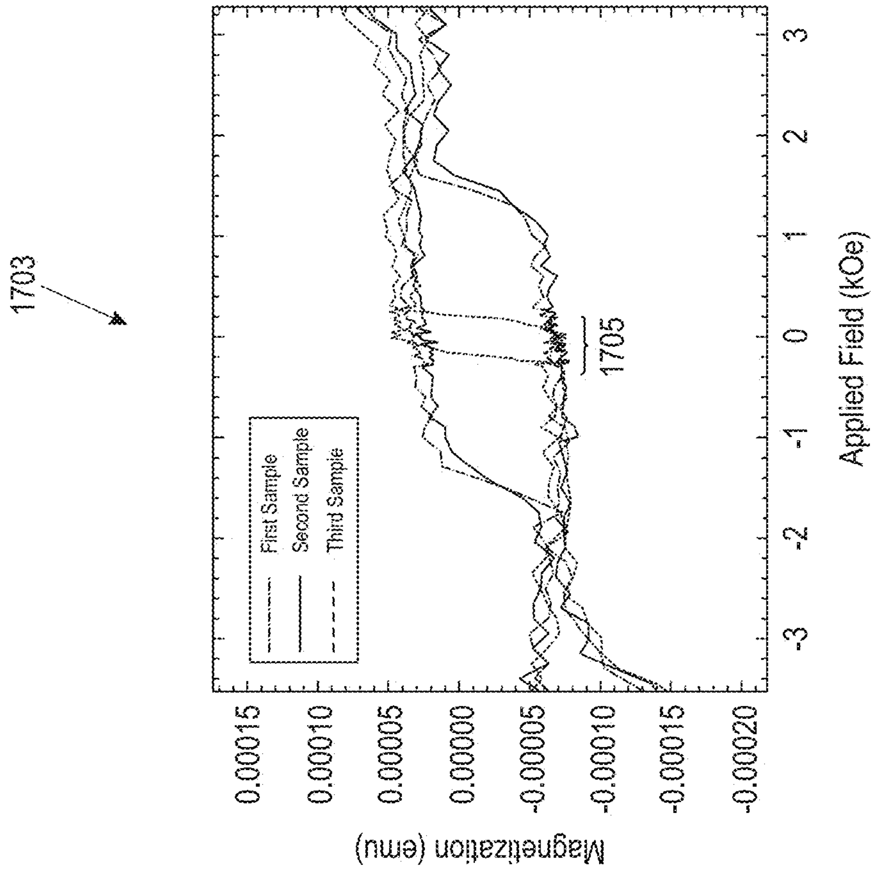

FIGS. 12A and 12B show the influence of the thickness of the $Sc_xN$ interfacial layer on the magnetization and coercivity of the $Mn_3Ge$ layer, for three samples with the following exemplary compositions:

First sample: 50 Å Ta, 5 Å $(CoFe)_{80}B_{20}$, 0.5 Å $Sc_xN$, 400 Å Cr, 50 Å IrAl, 150 Å CoAl, 15 Å $Mn_3Ge$ annealed at about 340 degrees C., 14.3 Å MgO, 7 Å $(CoFe)_{70}B_{30}$, 7.5 Å $(CoFe)_{80}B_{20}$, 2.4 Å Ta annealed at about 255 degrees C., SAF, and 100 Å Ru, with 31.59% TMR and 6.44 $\Omega\mu m^2$ RA (product of resistance and area).

Second sample: 50 Å Ta, 5 Å $(CoFe)_{80}B_{20}$, 1.5 Å $Sc_xN$, 400 Å Cr, 50 Å IrAl, 150 Å CoAl, 15 Å $Mn_3Ge$ annealed at about 340 degrees C., 14.4 Å MgO, 7 Å $(CoFe)_{70}B_{30}$, 7.5 Å $(CoFe)_{80}B_{20}$, 2.4 Å Ta annealed at about 255 degrees C., SAF, and 100 Å Ru, with 45.58% TMR and 7.26 $\Omega\mu m^2$ RA.

Third sample: 50 Å Ta, 5 Å $CoFe)_{80}B_{20}$, 5 Å $Sc_xN$, 400 Å Cr, 50 Å IrAl, 150 Å CoAl, 15 Å $Mn_3Ge$ annealed at about 340 degrees C., 14.4 Å MgO, 7 Å $(CoFe)_{70}B_{30}$, 7.5 Å $(CoFe)_{80}B_{20}$, 2.4 Å Ta annealed at about 255 degrees C., SAF, and 100 Å Ru, with 49.62% TMR and 6.63 $\Omega\mu m^2$ RA.

Note the plots 1701 showing the magnetization in emu versus applied magnetic field in kilo-Oersteds and 1703 showing the coercivity in emu versus applied magnetic field in kilo-Oersteds. It can be seen that the coercivity of the $Mn_3Ge$ layer is similar for $Sc_xN$ thicknesses of 0.5 Å and 1.5 Å, with a preferable thickness <2 to 2.5 Å. At thicknesses of 5+Å $Sc_xN$, there is a substantial decrease in coercivity $H_c$ and a possible increase in saturation magnetization $M_s$ of 15 Å $Mn_3Ge$. Furthermore in this regard, consider a very thin $Sc_xN$, layer less than 2 Å (e.g. 0.5 Å, 1.5 Å $Sc_xN$). Consider the coercivity of the $Mn_3Ge$ in plot 1703. It can be seen that the coercivity at which the magnetization of $Mn_3Ge$ switches is fairly high (about 1.5 kilo-Oersted (kOe)) for the first and second samples. However, if the thicker $Sc_xN$ is used, which is not an interfacial layer (third sample), the coercivity goes down significantly while the TMR goes up—see region 1705. This demonstrates that if there is interdiffusion; the coercivity decreases for the same thickness of Heusler material as would otherwise be seen. This essentially provides a signature such that it is not necessary to carry out TMR sampling/measurement; rather, it can be concluded from coercivity determination that there is less interdiffusion with the thinner $Sc_xN$ interfacial layer.

The table of FIG. 13 explores the effect on coercivity and TMR with $Mn_3Ge$ of alternate nitride dusting (interfacial) layers and other processes as noted. The coercivity and TMR of various nitride dusting layers (~0.5 Å) is similar. There is some variation in coercivities; however, that could be attributed to slight thickness variations within different series of samples. High coercivity is maintained with thicker TaN dusting layers, which may be an indication that at the TaN composition used here, the layer is still amorphous. Lower coercivity is likely an indication of interdiffusion. In the table of FIG. 13, the first column lists the type of interfacial nitride layer or process; the second column lists the thickness or duration of the process; the third column lists the TMR; the fourth column lists the RA value; the fifth column lists the coercivity $H_c$ measured with a vibrating-sample magnetometer (VSM); the sixth column lists the texture (crystal orientation) from X-ray diffraction; the seventh column lists the power used during sputter deposition; and the final column lists whether the particular row exhibits "acceptable" TMR and PMA (layer/process works) or "unacceptable" (layer/process does not work). Note that IBD=ion beam deposition. For the "Nitrogen exposure, IBD and Nitrogen exposure, sputter" entries, there was no attempt made to affirmatively grow a nitride layer, but the sample was exposed to nitrogen using IBD and sputter source, to determine whether nitrogen incorporation by itself was significant. That did not result in a functioning system. It was accordingly concluded that the presence of a material known to be a robust nitride is pertinent in one or more embodiments. Typically, we have found that an ultrathin (e.g., less than 2 Å) thickness of such robust nitride material is effective. For example, note for 0.5 Å of $Sc_xN$, a high coercivity of 6 kOe, while for a 5 Å thickness, the coercivity drops significantly to 1.7 kOe (while the TMR increases from 50.02 to 56.59). Similarly, note for 0.5 Å of TiN a high coercivity of 8 kOe, while for a 5 Å thickness, the coercivity drops significantly to 1.3 kOe (while the TMR increases from 52.14 to 60.79). We have found that this reduction in coercivity is a first indicator/signature of interdiffusion (in the example, interdiffusion of the $Mn_3Ge$ layer).

Figure 14A:
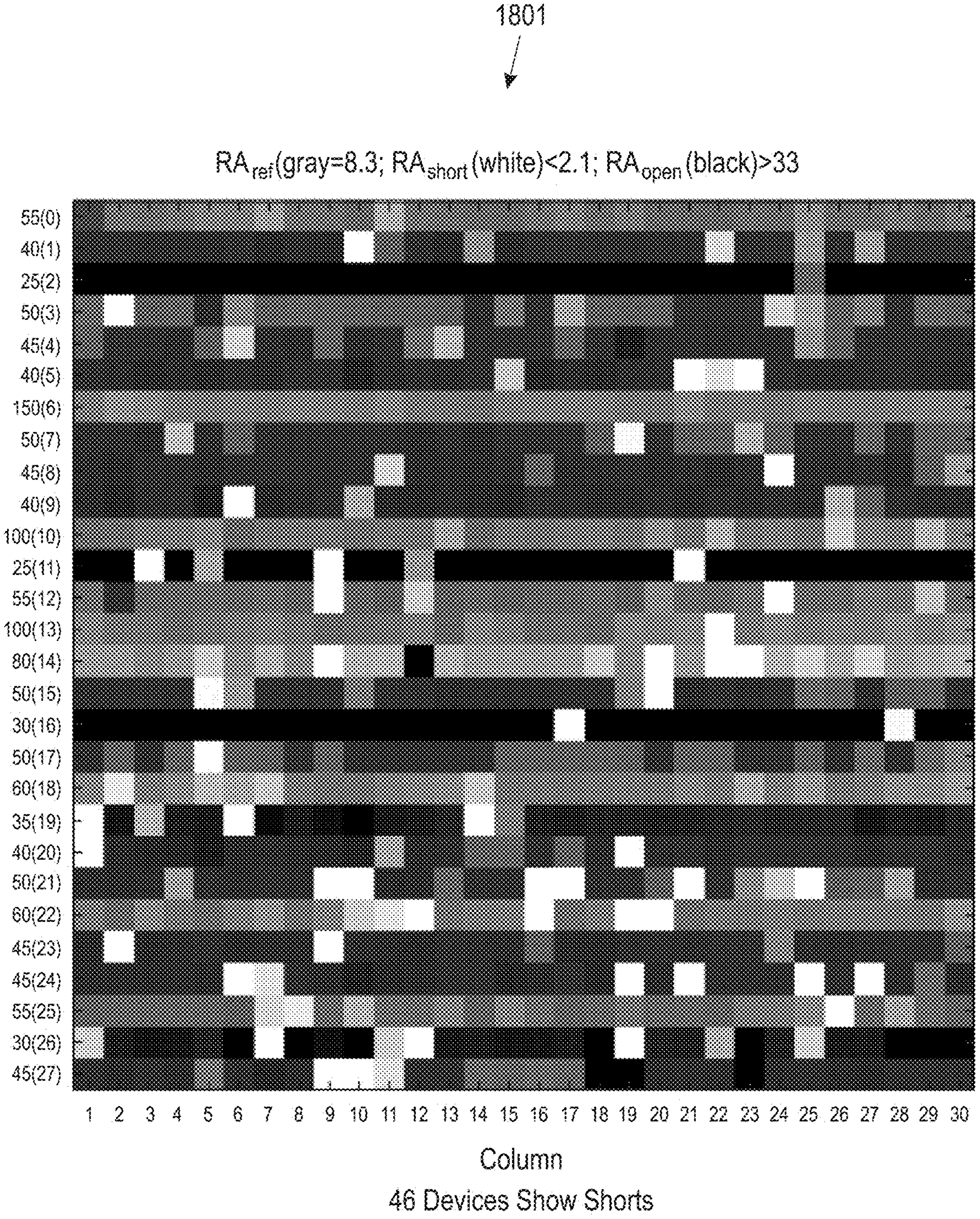
FIGS. 14A and 14B compare results for $Sc_xN$ insertion samples—50 Å versus dusting (interfacial), according to aspects of the invention.
Figure 14B:
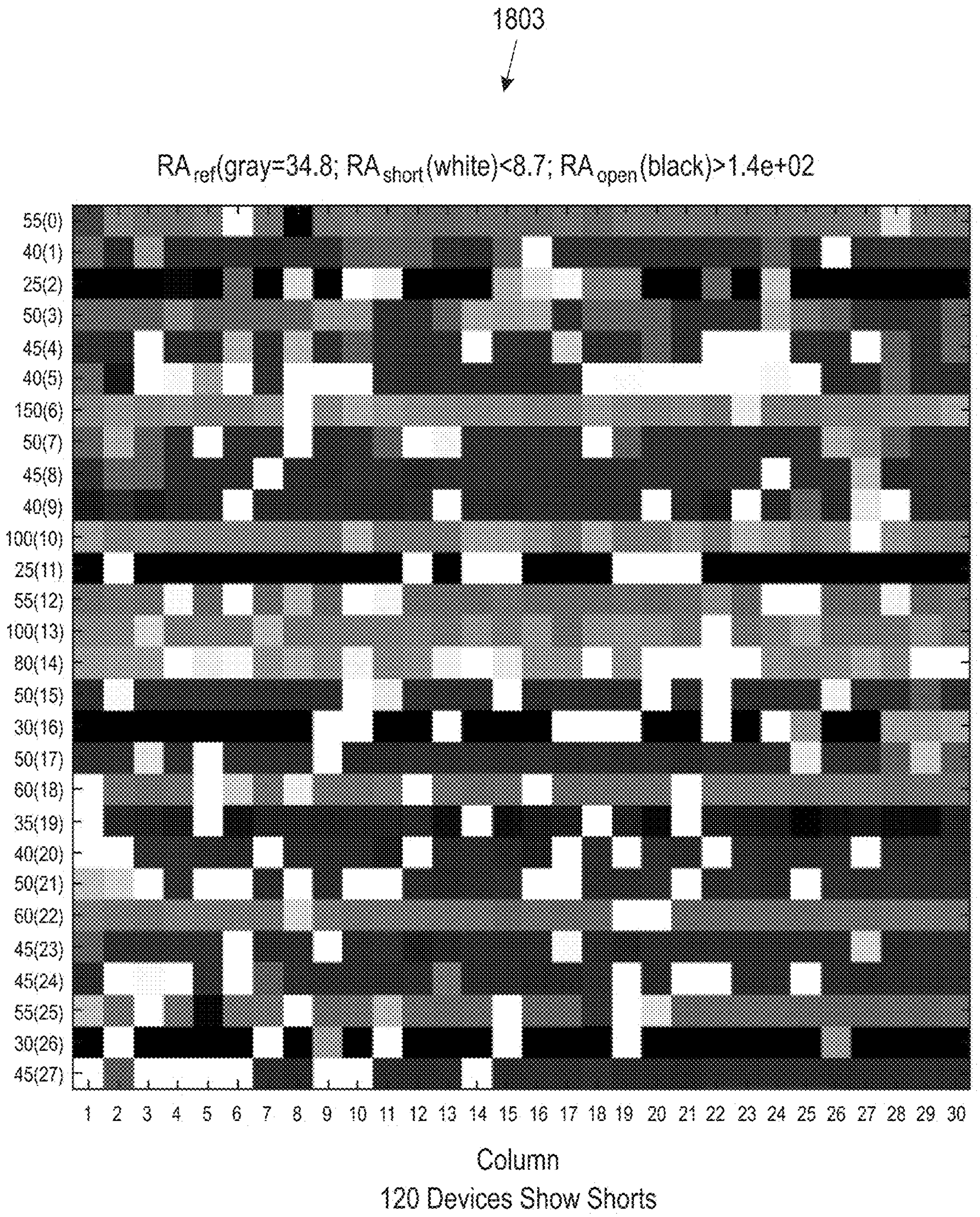

FIGS. 14A and 14B compare results of $Sc_xN$ insertion samples—dusting/interfacial (view 1801) versus 50 Å (view 1803). FIGS. 14A and 14B are a yield map of the devices on a wafer where each square represents a MTJ device. In view 1801, 46 devices show shorts, while in view 1803, 120 devices show shorts. The electrical yield for the 0.5 Å $Sc_xN$ sample is superior due to presence of the interfacial $Sc_xN$ spacer layer. The 50 Å $Sc_xN$ sample has a greater number of "low-RA" devices, likely a result of a slight ion mill etch of the IrAl layer. Etch time can be readjusted to reduce potential shorting even further. The sample 1801 includes: 50 Å Ta, 5 Å $(CoFe)_{80}B_{20}$, 0.5 Å $Sc_xN$, 400 Å Cr, 50 Å IrAl, 100 Å $Sc_xN$, 150 Å CoAl, 19 Å $Mn_3$ Ge annealed at about 340 degrees C., 15 Å MgO, CoFeB and SAF. The sample 1803 includes: 50 Å Ta, 5 Å $(CoFe)_{80}B_{20}$, 50 Å $Sc_xN$, 400 Å Cr, 50 Å IrAl, 150 Å CoAl, 19 Å $Mn_3Ge$ annealed at about 340 degrees C., 15.5 Å MgO, CoFeB and SAF. FIGS. 14A and 14B thus depict additional device-level measurements. One sample was interfacial $Sc_xN$ (0.5 Å) while the other is relatively thick $Sc_xN$ (50 Å). The rest of the stack was the same for each case. The plots show the yield in each case.

Figure 15A:
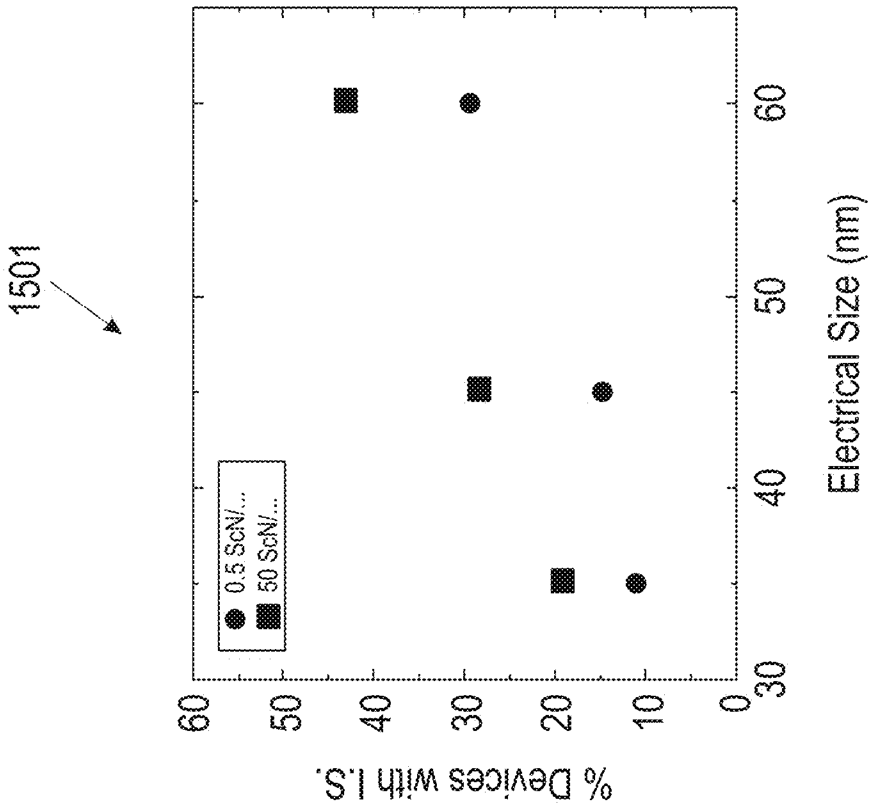
FIGS. 15A and 15B compare the percentage of devices with intermediate states—50 Å versus dusting (interfacial), according to aspects of the invention.
Figure 15B:
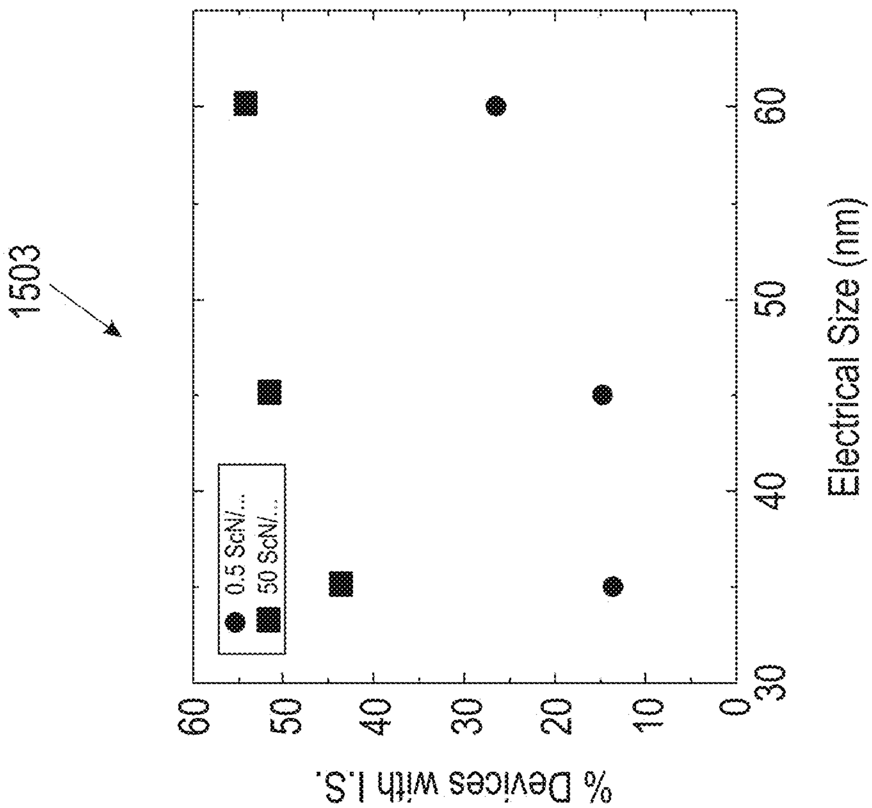

FIGS. 15A and 15B compare results of $Sc_xN$ insertion samples—dusting/interfacial versus 50 Å. View 1501 shows the overall percentage of devices with intermediate states as a function of electrical size in nm, while view 1503 shows the percentage of devices with intermediate states as a function of electrical size in nm, where devices are preselected for $H_c$>1.5 kOe. In each view, the square data points are for the 50 Å $Sc_xN$ sample 1803 while the round data points are for the 0.5 Å $Sc_xN$ sample 1801. On average, the sample with 0.5 Å $Sc_xN$ shows a lower percentage of devices with intermediate states across different sizes. Note that the sample with 0.5 Å $Sc_xN$ has $H_c$>5.5 kOe while the 50 Å $Sc_xN$ sample has $H_c$ of 3.5 kOe. Since the two samples are not identical in terms of Current In-Plane Tunneling (CIPT)-$H_c$ as well as device-$H_c$, a filter ($H_c$>1500 Oe) was used, as lower $H_c$ devices tend not to exhibit intermediate states. The difference in the percentage of devices having intermediate states becomes clearer with the preselection for $H_c$>1500 Oe. In the plots of FIGS. 15A and 15B, sizes were binned using a range of +/−2.5 nm, such that, by way of example, 35 nm includes devices within 32.5 to 37.5 nm.

FIGS. 15A and 15B thus show the number of devices exhibiting undesirable intermediate states. What is desired in a MTJ device is a bistable device; i.e., two states with one as a parallel state and other as an anti-parallel state. An intermediate state, where the device is partially switched between a parallel state and an anti-parallel sate, is undesirable. It can be seen that by the use of the "dusting/interfacial" layer of $Sc_xN$, the number of devices exhibiting an intermediate state drops dramatically as compared to the thick (50 Å) layer. The same effect is seen in view 1503 for devices preselected for high coercivity. We have found that the presence of intermediate states is a second indicator/signature of interdiffusion.

Thus, it will be appreciated, given the teachings herein, that interfacial nitride treatment facilitates PMA of ultra-thin Heusler films. TMR with the interfacial nitride treatment is comparable to TMR with a thick nitride layer of $Sc_xN$, $Mn_xN$, $Ti_xN$, or the like. A high level of structural ordering and epitaxial growth is observed, even with an interfacial nitride layer on Si substrates. This insensitivity to the choice of interfacial nitride material advantageously frees up a target spot within the deposition system, as a specific material is not necessarily needed for this layer. Interfacial nitridation can be achieved by alternate techniques, e.g., exposure to a nitrogen atom source, a milling source with nitrogen as the process gas, or the like. The overall MTJ stack is simpler as compared to the stack with a thick nitride layer. The interfacial nitride layer is non-detectable by normal characterization means such as TEM or SIMS; one exception is a 10 Å TaN nitride layer, which does provide improved TMR over the interfacial nitride layer while still maintaining high film coercivity.

As noted, the Heusler layer can be produced via growth on a suitable templating layer. By way of review, in a templating concept a templating layer is grown and another layer (e.g., Heusler compound) is grown on top of it. Templating essentially means that the layer being grown on the templating layer grows to the lattice constant a of the underlayer/seed layer.

It is worth noting that, generally, we have found that an interfacial nitride layer is advantageous for all material stacks which include any combination of CTL/Heusler systems. Referring again to FIG. 2, CoAl is a layered structure. In the Heusler compound 403, the all-Mn layer, because it contains only a transition metal, prefers to grow on the Al of the templating layer, while the MnSb layer, because it also has a main group element, prefers to grow on the Co, and thus ordering is obtained in the material 403. Atomic steps 405 are inherent in the templating layer 401 but do not disturb the ordering in the Heusler material 403.

FIG. 16 shows an embodiment with a Heusler compound as a storage layer 1205. The seed layer 1203 will typically include the interfacial nitride and overlying CTL, with or without a Cr layer, and is located on substrate 1201. Substrate 1201 is typically silicon with CMOS circuitry such as transistors and access lines permitting selection of individual devices. Other than the novel cells described herein, conventional transistors, access lines, peripheral circuits, and the like can be employed—refer to discussion of FIG. 18 below. The CTL or even a multilayer of CTLs can be grown on a suitable surface such as the interfacial nitride. Heusler layer 1205 is located on the CTL, and can be formed, for example, by epitaxial growth on the CTL. Polarization enhancement layer 1207 is optionally located outward of layer 1205; layer 1207, where present, can include, for example, a thin layer of magnetic material such as cobalt. Tunnel barrier 1209 is located outward of layer 1207 (where present), else outward of layer 1205; barrier 1209 can include, for example, MgO, $MgAl_2O_4$, or the like. Magnetic layer 1211 includes conventional cobalt, iron, nickel, or alloys, or could also include Heusler or half-Heusler materials. Synthetic anti-ferromagnet (SAF) layer 1213, where present, is located outward of layer 1211. Typically a Synthetic Anti-Ferromagnet (SAF) layer includes a Co/Pt multilayer (not shown) that is magnetically coupled to the underlying magnetic layer to achieve needed performance. A thin layer (not shown) of Ta or Ir or Ru (order of few Å) may typically be interposed between the magnetic layer and the SAF layer. Cap layer 1215 is located outward of layer 1213 (where present), else outward of layer 1211. The cap layer may include Mo, W, Ta, Pt, Ru, or a combination thereof. In FIG. 16, double-headed arrow 1221 indicates the storage layer wherein the magnetization can be changed, while single-headed arrow 1223 indicates the reference layer with constant/fixed magnetization.

In some instances, interstitial nitride is provided with over-stoichiometric nitrogen composition (promoting nitrogen diffusion from interfacial nitride into the Heusler layer). Some embodiments include annealing during Heusler layer sputtering (promoting nitrogen diffusion from interfacial nitride into Heusler layer and then diffusion of nitrogen to the Heusler layer upper surface, thus decreasing surface energy). In some cases, nitrogen co-sputtering is carried out during Heusler layer deposition, especially the early stages thereof (promoting nitrogen diffusion into the Heusler layer for subsequent diffusion of nitrogen to the Heusler layer upper surface, thus decreasing surface energy).

FIG. 17 shows an embodiment with a Heusler compound as a reference layer. The seed layer 1303 will typically include interfacial nitride and overlying CTL, with or without a Cr layer, and is located on substrate 1301. Heusler layer 1305 is located on the CTL, and can be formed, for example, by epitaxial growth on the CTL. Polarization enhancement layer 1307 is optionally located outward of layer 1305. Tunnel barrier 1309 is located outward of layer 1307 (where present), else outward of layer 1305. Magnetic layer 1311 includes conventional cobalt, iron, nickel, or alloys, or could also include Heusler or half-Heusler materials. Cap layer 1313 is located outward of layer 1311. In FIG. 17, double-headed arrow 1323 indicates the storage layer wherein the magnetization can be changed, while single-headed arrow 1321 indicates the reference layer with constant/fixed magnetization. The comments regarding materials in FIG. 16 are generally applicable to FIG. 17 as well.

In both FIG. 16 and FIG. 17, the Heusler layer is typically located on top of the templating layer, due to the epitaxial growth in the fabrication process.

One or more embodiments thus provide a structure including a substrate, and an interfacial nitride layer, formed with Mn, Sc, Ti, Cr, V, or the like, overlying the substrate. The nitride layer thickness is less than 2 Å in one or more embodiments, except for the case where nitride layer used is TaN in which case the nitride layer thickness is less than 10 Å. One or more embodiments further include a templating layer including a binary alloy having a CsCl structure, and a magnetic layer overlying the templating layer. The magnetic layer includes a Heusler compound whose magnetization is substantially perpendicular to the layer.

The Heusler compound can be, for example, $Mn_3Ge$, and can have a thickness of, for example, less than 5 nm.

In one or more embodiments, the binary alloy with CsCl structure is represented by $A_{1-x}E_x$, where A is a transition metal element and E is a main group element. For example, A includes Co and E includes at least aluminum or gallium and possibly traces of other elements (e.g., Al or Ga; or Al alloyed with Ga, Ge, Sn, or any combination thereof, such as AlSn, AlGe, AlGaGe, AlGaSn, AlGeSn, and AlGaGeSn), and x is in the range from 0.42 to 0.55.

In some cases, tunnel barrier is in contact with the Heusler layer.

In some cases, the tunnel barrier is MgO.

In one or more embodiments, the Heusler compound is chosen from the group consisting of $Mn_3Sn$, $Mn_3Sb$, $Mn_2CoSn$, $Mn_2FeSb$, $Mn_3CoAl$, $Mn_2CoGe$, $Mn_2CoSi$, $Mn_2CuSi$, $Co_2CrAl$, $Co_2CrSi$, $Co_2MnSb$, and $Co_2MnSi$.

In some cases, the Heusler layer has a thickness of less than 5 nm. In some such cases, the binary alloy is represented by $A_{1-x}E_x$, where A is a transition metal element and E is a main group element. For example, A includes Co and E includes at least aluminum or gallium and possibly traces of other elements (e.g., Al or Ga; or Al alloyed with Ga, Ge, Sn, or any combination thereof, such as AlSn, AlGe, AlGaGe, AlGaSn, AlGeSn, and AlGaGeSn), and x is in the range from 0.42 to 0.55.

In some cases, the tunnel barrier is $MgAl_2O_4$, which can be used as a tunnel barrier whose lattice spacing can be tuned (engineered) by controlling the Mg—Al composition to result in better lattice matching with the Heusler compounds (e.g., the composition of this tunnel barrier can be represented as $Mg_{1-z}Al_{2+(2/3)z}O_4$, wherein $-0.5<z<0.5$).

As will be appreciated by the skilled artisan, typically, the magnetization is not fixed, but rather, the magnetization precesses like a spinning top at a non-zero temperature. This can change depending on temperature. In view of this precession, perpendicularity, as used herein, refers to perpendicularity of the time integral/average of the path of the magnetization. The time integral/average of the path of the magnetization could be, for example, "exactly" perpendicular, perpendicular within ±5%, or perpendicular within ±10%.

In some such cases, the templating layer or chemical templating layer which is a binary alloy is represented by $A_{1-x}E_x$, where A is a transition metal element and E is a main group element. For example, A includes Co and E includes at least aluminum or gallium and possibly traces of other elements (e.g., Al or Ga; or Al alloyed with Ga, Ge, Sn, or any combination thereof, such as AlSn, AlGe, AlGaGe, AlGaSn, AlGeSn, and AlGaGeSn), and x is in the range from 0.42 to 0.55. In some such cases, a tunnel barrier 1209, 1309 is located in contact with the half metallic Heusler multi-layer; the tunnel barrier can include, for example, MgO (magnesium aluminum oxide is a suitable alternative to MgO with magnesium aluminum oxide having the form $Mg_{1-z}Al_{2+(2/3)z}O_4$, wherein $-0.5<z<0.5$).

It should be noted that the half metallic Heusler compounds are indicated by stoichiometric formulas and this does not preclude small variations of up to several % from the nominal values.

Figure 18:
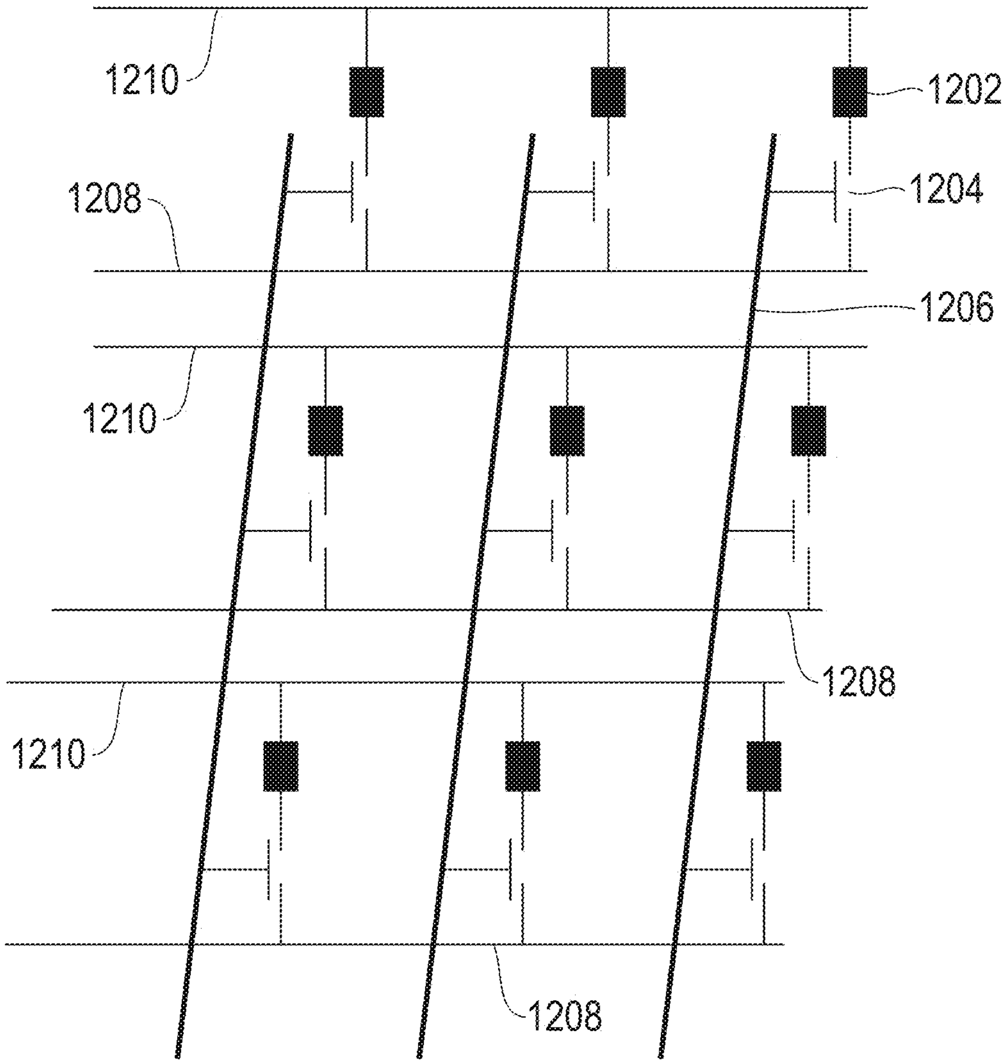
FIG. 18 shows an array of MRAM cells, according to an aspect of the invention.

Referring now to FIG. 18, an array of MRAM devices 1202 is shown. Each cell 1202 (e.g., embodiment of FIG. 16 or FIG. 17) is connected to a respective transistor 1204 that controls reading and writing. A word line 1206 provides data to write to the cells 1202, while a bit line 1210 and a bit line complement 1208 read data from the cell 1202. In this manner, a large array of memory devices can be implemented on a single chip. An arbitrarily large number of cells 1202 can be employed, within the limits of the manufacturing processes and design specifications.

Writing data to a cell 1202 includes passing a current through the cell. This current causes the direction of magnetization to switch between a parallel or anti-parallel state, which has the effect of switching between low resistance and high resistance. Because this effect can be used to represent the 1s and 0s of digital information, the cells 1202 can be used as a non-volatile memory. Passing the current in one direction through the cell 1202 causes the magnetization of the free layer 1205, 1311 to be parallel with that of the reference layer 1211, 1305, while passing the current in the other direction through the cell 1202 causes the magnetization of the free layer 1205, 1311 to be antiparallel to that of the reference layer 1211, 1305. Reading the bit stored in a cell 1202 involves applying a voltage (lower than that used for writing information) to the cell 1202 to discover whether the cell offers high resistance to current ("1") or low resistance ("0").

Figure 22:
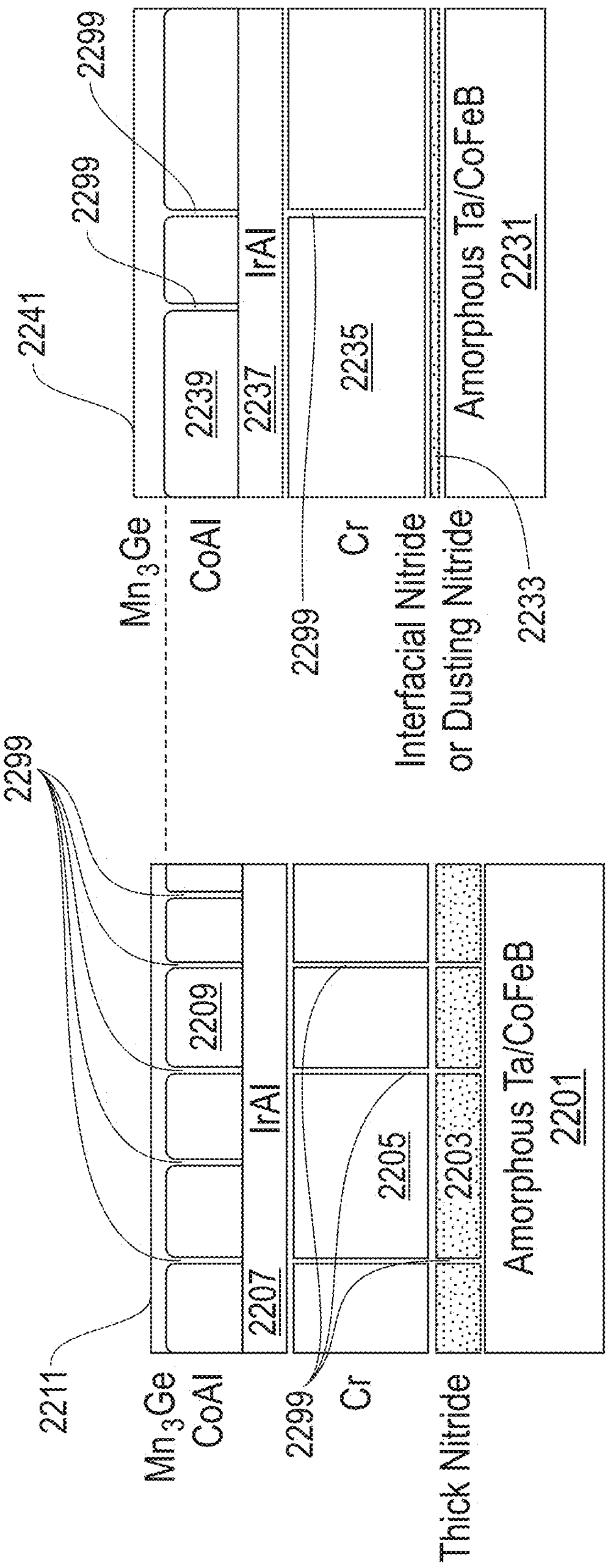
FIG. 22 presents an exemplary comparison between technology not using aspects of the invention and an exemplary embodiment of the invention.

FIG. 22 presents an exemplary comparison between a structure not using aspects of the invention (left) and an exemplary embodiment of the invention (right). On the left, note amorphous tantalum/cobalt-iron-born 2201, relatively thick nitride 2203, chromium 2205, iridium aluminum 2207, CoAl 2209, and $Mn_3Ge$ 2211 with grain boundaries 2299. This structure is characterized by low coercivity (2-3 kOe), more grains per lateral length compared to the structure on the right, and relatively more diffusion compared to the structure on the right as measured by transmission electron microscopy (TEM). On the right, note amorphous tantalum/cobalt-iron-born 2231, relatively thin interfacial/dusting nitride 2233, chromium 2235, iridium aluminum 2237, CoAl 2239, and $Mn_3Ge$ 2241 with grain boundaries 2299. This structure is characterized by high coercivity (5.5-6 kOe), fewer grains per lateral length compared to the structure on the left, and relatively less diffusion compared to the structure on the left as measured by transmission electron microscopy (TEM).

It is worth noting that one or more embodiments employ a sub-nm interfacial nitride layer that can promote the (001) texture in the overlying layers (including the CTL) and induce a larger grain size in overlying layers (including the chemical templating layer) for perpendicularly magnetized Heusler films. One or more embodiments employ the interfacial nitride layer as a seed layer to induce the (001) texture in the chemical templating layer and Heusler layer. In one or more embodiments, the interfacial nitride layer in the present invention is sub-nm in thickness (<1 nm) and does not have the (001) orientation by itself.

Figure 23:
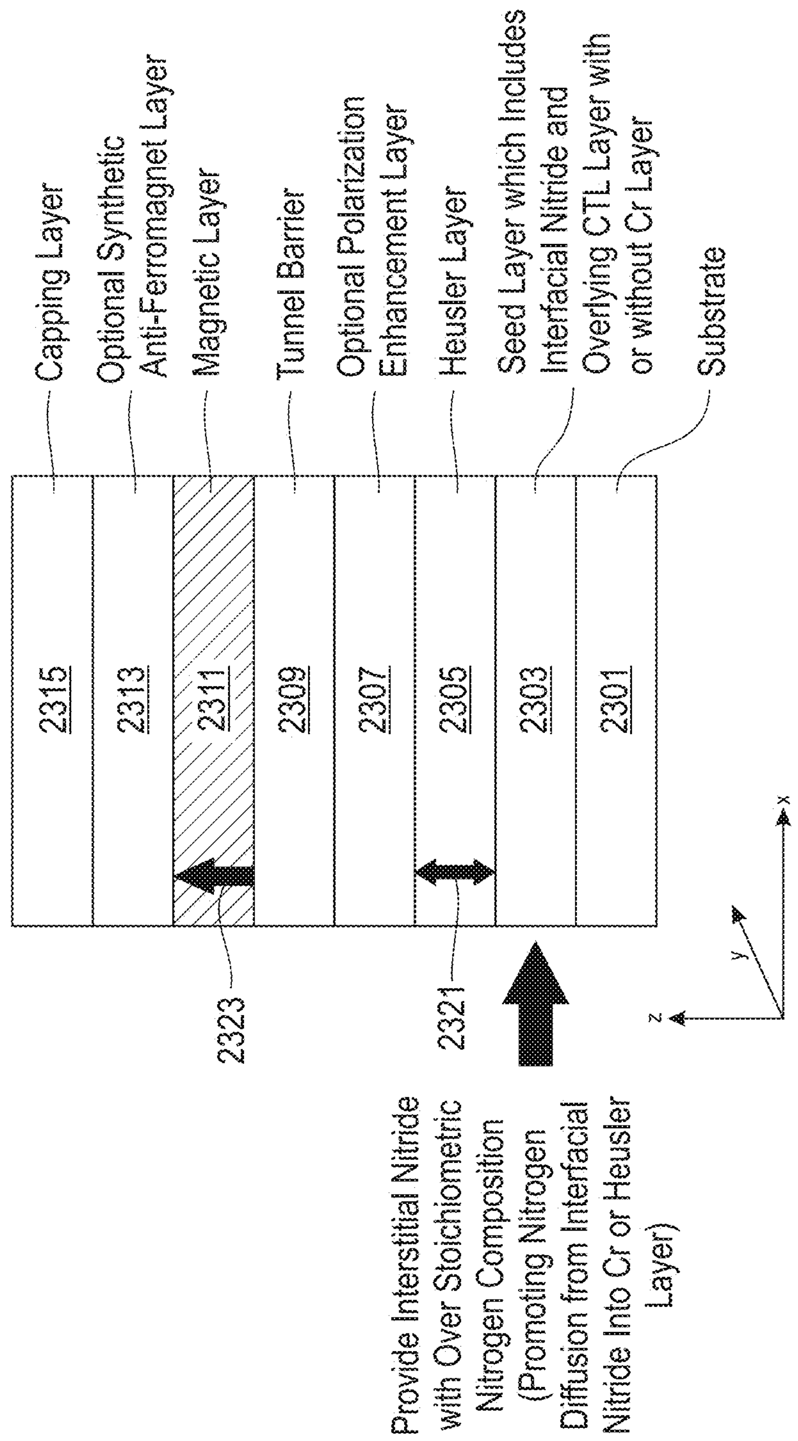
FIG. 23 shows another embodiment with a Heusler compound as a storage layer.

FIG. 23, similar to FIG. 16, shows an embodiment with a Heusler compound as a storage layer. Elements 2301, 2303, 2305, 2307, 2309, 2311, 2313, 2315, 2321, and 2323 in FIG. 23 are analogous to elements 1201, 1203, 1205, 1207, 1209, 1211, 1213, 1215, 1221, and 1223 in FIG. 16. In the embodiment of FIG. 23, interstitial nitride is provided with over stoichiometric nitrogen composition (extra nitrogen resides within the interstices of the lattice, not bound to a lattice location—interfacial nitride has interstitial nitrogen), advantageously promoting nitrogen diffusion from the interfacial nitride into the Cr or the Heusler layer.

Figure 24:
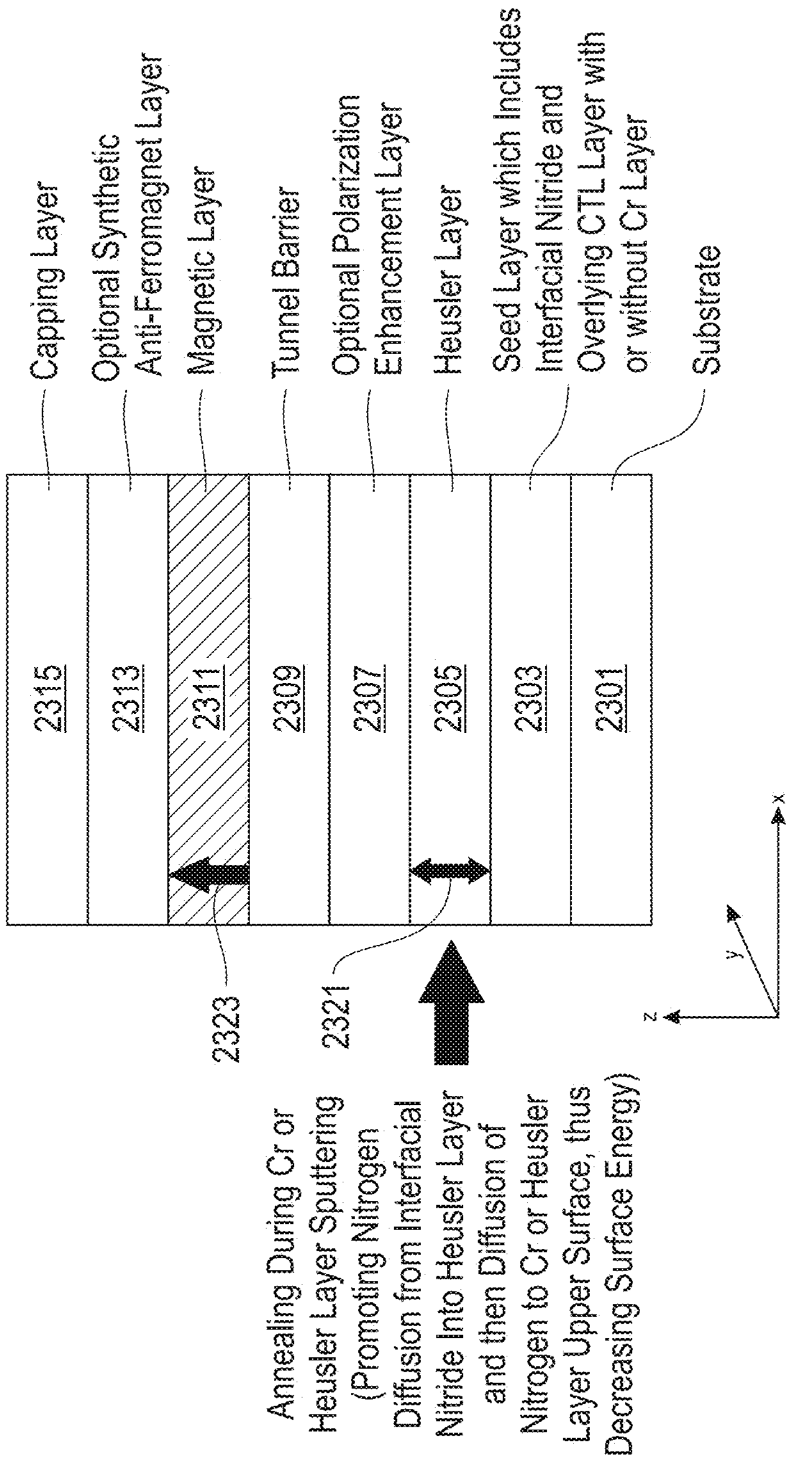
FIG. 24 shows yet another embodiment with a Heusler compound as a storage layer.

FIG. 24, similar to FIG. 16, shows an embodiment with a Heusler compound as a storage layer. Elements 2301, 2303, 2305, 2307, 2309, 2311, 2313, 2315, 2321, and 2323 in FIG. 24 are analogous to elements 1201, 1203, 1205, 1207, 1209, 1211, 1213, 1215, 1221, and 1223 in FIG. 16. In the embodiment of FIG. 24, annealing is carried out during Cr or Heusler layer sputtering, advantageously promoting nitrogen diffusion from the interfacial nitride into the Heusler layer and then diffusion of nitrogen to the Cr or Heusler layer upper surface, thus decreasing surface energy.

Figure 25:
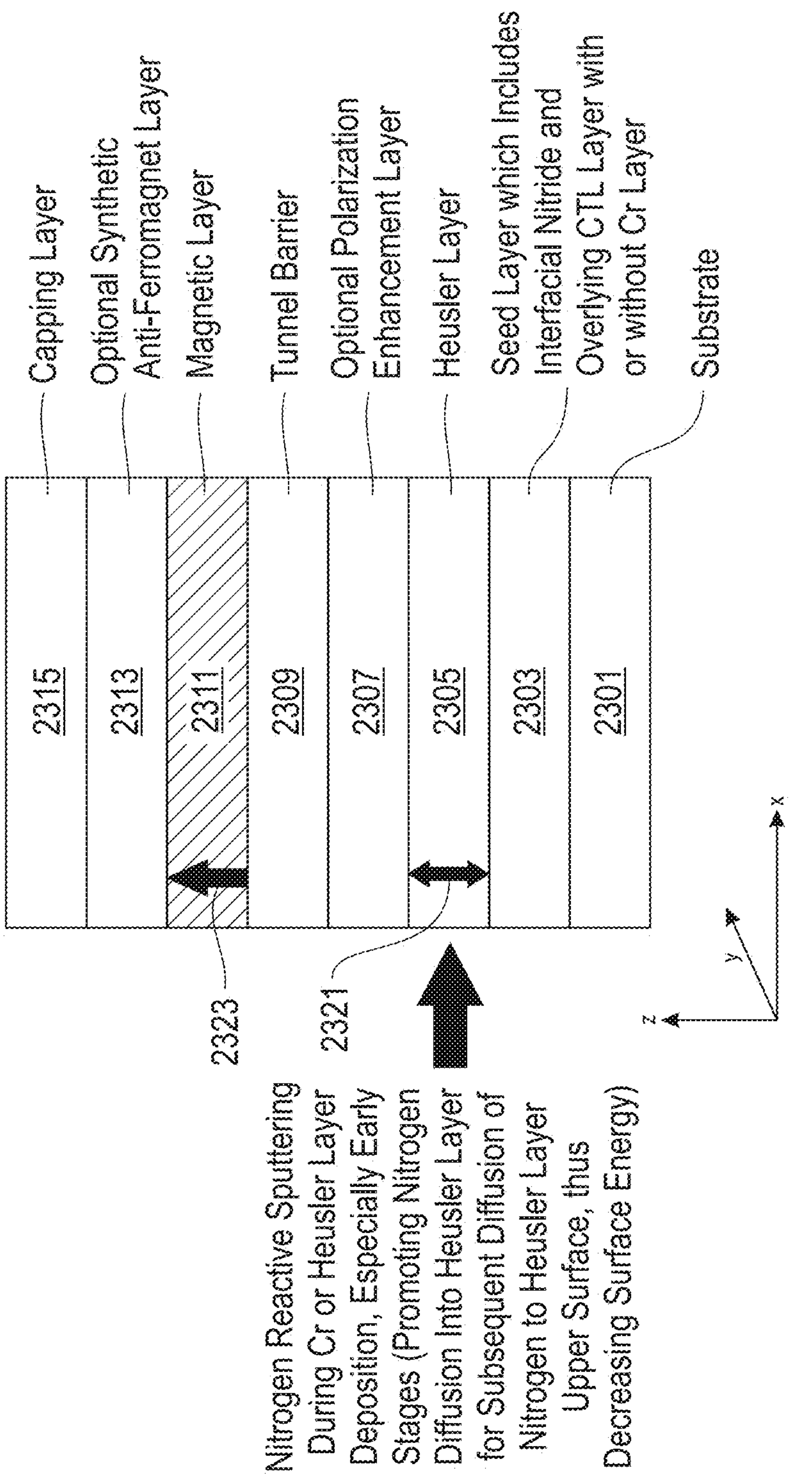
FIG. 25 shows still another embodiment with a Heusler compound as a storage layer.

FIG. 25, similar to FIG. 16, shows an embodiment with a Heusler compound as a storage layer. Elements 2301, 2303, 2305, 2307, 2309, 2311, 2313, 2315, 2321, and 2323 in FIG. 25 are analogous to elements 1201, 1203, 1205, 1207, 1209, 1211, 1213, 1215, 1221, and 1223 in FIG. 16. In the embodiment of FIG. 25, nitrogen reactive sputtering is carried out during Cr or Heusler layer deposition, especially the early stages thereof, advantageously promoting nitrogen diffusion into the Heusler layer for subsequent diffusion of nitrogen to the Heusler layer upper surface, thus decreasing surface energy.

Semiconductor device manufacturing includes various steps of device patterning processes. For example, the manufacturing of a semiconductor chip may start with, for example, a plurality of CAD (computer aided design) generated device patterns, which is then followed by effort to replicate these device patterns in a substrate. The replication process may involve the use of various exposing techniques and a variety of subtractive (etching) and/or additive (deposition) material processing procedures. For example, in a photolithographic process, a layer of photo-resist material may first be applied on top of a substrate, and then be exposed selectively according to a pre-determined device pattern or patterns. Portions of the photo-resist that are exposed to light or other ionizing radiation (e.g., ultraviolet, electron beams, X-rays, etc.) may experience some changes in their solubility to certain solutions. The photo-resist may then be developed in a developer solution, thereby removing the non-irradiated (in a negative resist) or irradiated (in a positive resist) portions of the resist layer, to create a photo-resist pattern or photo-mask. The photo-resist pattern or photo-mask may subsequently be copied or transferred to the substrate underneath the photo-resist pattern.

There are numerous techniques used by those skilled in the art to remove material at various stages of creating a semiconductor structure. As used herein, these processes are referred to generically as “etching”. For example, etching includes techniques of wet etching, dry etching, chemical oxide removal (COR) etching, ion milling, and reactive ion etching (RIE), which are all known techniques to remove select material(s) when forming a semiconductor structure. The Standard Clean 1 (SC1) contains a strong base, typically ammonium hydroxide, and hydrogen peroxide. The SC2 contains a strong acid such as hydrochloric acid and hydrogen peroxide. The techniques and application of etching is well understood by those skilled in the art and, as such, a more detailed description of such processes is not presented herein.

Although the overall fabrication method, including the epitaxial growth of the Heusler material on the templating layer facilitated by the thin nitride layer, and the structures formed thereby, are novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example: James D. Plummer et al., *Silicon VLSI Technology: Fundamentals, Practice, and Modeling* *1st Edition*, Prentice Hall, 2001 and P. H. Holloway et al., *Handbook of Compound Semiconductors: Growth, Processing, Characterization, and Devices*, Cambridge University Press, 2008, which are both hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

Given the discussion thus far, it will be appreciated that, in general terms, an exemplary magnetoresistive random-access memory cell includes a substrate 1201, 1301; a sub-monolayer nitride layer, outward of the substrate, and having a sub-monolayer nitride layer thickness less than 10 Angstroms; and a templating layer, outward of the sub-monolayer nitride layer, including a binary alloy having an alternating layer lattice structure. The sub-monolayer nitride layer and the templating layer are depicted at 1203, 1303 in FIGS. 16 and 17, respectively. The sub-monolayer nitride layer can include, for example, any of the nitride compounds disclosed herein. Also included is a Heusler layer 1205, 1305 located outward of the templating layer. The Heusler layer includes a Heusler compound and exhibits perpendicular magnetic anisotropy (PMA). Regarding PMA, note the discussions on the time integral/average of the path of the magnetization elsewhere herein. A tunnel barrier 1209, 1309 is outward of the Heusler layer and a magnetic layer 1211, 1311 is outward of the tunnel barrier.

In some cases (FIG. 16, e.g.), the Heusler layer includes a storage layer and the magnetic layer includes a reference layer; on the other hand, in some cases (FIG. 17, e.g.), the Heusler layer includes a reference layer and the magnetic layer includes a storage layer.

In either of these cases, various other aspects are contemplated. For example, in one or more embodiments, the Heusler compound is selected from the group consisting of $Mn_3Ge$, $Mn_3Sn$, $Mn_3Sb$, $Mn_2CoSn$, $Mn_2FeSb$, $Mn_3CoAl$, $Mn_2CoGe$, $Mn_2CoSi$, $Mn_2CuSi$, $Co_2CrAl$, $Co_2CrSi$, $Co_2MnSb$, and $Co_2MnSi$. In some instances, the Heusler compound specifically includes $Mn_3Ge$.

Optionally, the Heusler layer has a thickness of less than 5 nm.

Optionally, the tunnel barrier is selected from the group consisting of magnesium oxide and magnesium aluminum oxide. In some instances, the tunnel barrier specifically includes magnesium oxide.

In some instances, the tunnel barrier includes $Mg_{1-z}Al_{2+(2/3)z}O_4$, wherein $-0.5<z<0.5$. Note that the lattice spacing can be tuned (engineered) by controlling the Mg—Al composition to result in better lattice matching with the Heusler compounds.

In some instances, the binary alloy is represented by $A_{1-x}E_x$, wherein A is a transition metal element and E is a main group element including at least one of aluminum and gallium, and x is in the range from 0.42 to 0.55. Optionally, A is specifically Co and E includes Al.

In one or more embodiments, the alternating layer lattice structure of the templating layer includes a cesium chloride structure.

An alternative magnetoresistive random-access memory cell includes a substrate 1201, 1301; a tantalum nitride layer, outward of the substrate, and having a tantalum nitride layer thickness ranging from a sub-monolayer to a maximum≤10 Angstroms±10%; and a templating layer, outward of the tantalum nitride layer. The templating layer includes a binary alloy having an alternating layer lattice structure. While an interfacial nitride layer and the templating layer are depicted at 1203, 1303 in FIGS. 16 and 17, respectively, these views are also generally representative of the embodiments with the tantalum nitride layer thickness of 10 Angstroms±10%. A Heusler layer 1205, 1305 is located outward of the templating layer. The Heusler layer includes a Heusler compound and exhibits perpendicular magnetic anisotropy (PMA). A tunnel barrier 1209, 1309 is outward of the Heusler layer and a magnetic layer 1211, 1311 is outward of the tunnel barrier.

As an aside, optionally, the templating layer has a templating layer in-plane lattice constant, and the Heusler in-plane lattice constant substantially matches the templating layer in-plane lattice constant. As used herein, the Heusler in-plane lattice constant "substantially matches" the templating layer in-plane lattice constant when it matches the templating layer in-plane lattice constant or when the in-plane lattice constant of the tetragonal Heusler material has moved towards the in-plane lattice constant of the templating material from the in-plane lattice constant of the cubic Heusler material. In some cases, the Heusler in-plane lattice constant matches the templating layer in-plane lattice constant within ±10%. In some cases, the Heusler in-plane lattice constant matches the templating layer in-plane lattice constant within ±5%. The half metallic Heusler material has, for example, a magnetization substantially perpendicular to the half metallic Heusler layer.

In another aspect, referring to FIG. 18, a magnetoresistive random-access memory array includes a plurality of bit lines 1210 and a plurality of complementary bit lines 1208 forming a plurality of bit line-complementary bit line pairs. A plurality of word lines 1206 intersect the plurality of bit line pairs at a plurality of cell locations. A plurality of magnetoresistive random-access memory cells 1202 are located at each of the plurality of cell locations. Each of the magnetoresistive random-access memory cells 1202 is electrically connected to a corresponding bit line 1210 and selectively interconnected to a corresponding one of the complementary bit lines 1208 under control of a corresponding one of the word lines 1206 (e.g., a respective transistor 1204 is a field effect transistor turned off or on by a signal from word line 1206 applied to its gate, which controls reading and writing and whether the cell is coupled to the complementary bit lines).

Each of the plurality of magnetoresistive random-access memory cells includes a cell as described elsewhere herein with respect to FIG. 16 and FIG. 17. Typically, the capping layer 1215 or 1313 of devices indicated in FIG. 16 and FIG. 17 connect to the bit line 1210 while the layer 1203 or 1303 connects to the bit line complement 1208 through the access FET.

In still another aspect, an exemplary method of operation includes providing an array such as just described, applying signals to the word lines 1206 to cause a first subset of the cells 1202 to store logical ones and a second subset of the cells 1202 to store logical zeroes; and reading the stored logical ones and zeroes via the bit lines 1210 and the complementary bit lines 1208.

Figure 19:
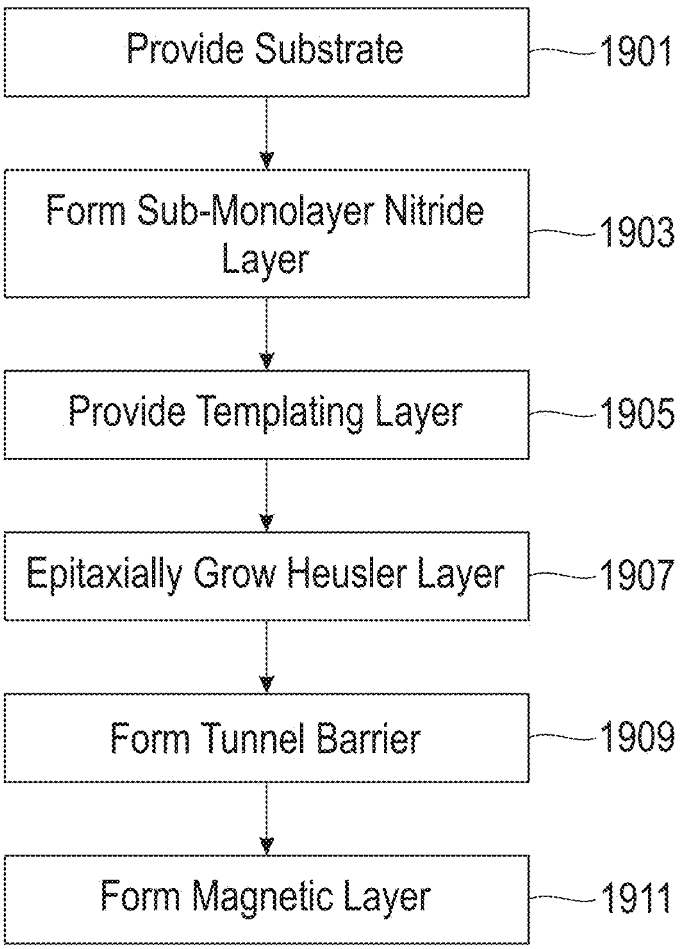
FIG. 19 shows a flow chart of a fabrication method, according to an aspect of the invention.

In yet another aspect, referring to FIG. 19, an exemplary method of forming a magnetoresistive random-access memory cell (such as in FIG. 16 or 17) includes, as per step 1901, providing a substrate 1201, 1301. A further step 1903 includes forming a sub-monolayer nitride layer (or alternatively, a tantalum nitride layer, having a tantalum nitride layer thickness of 10 Angstroms±10%), outward of the substrate, and having a sub-monolayer nitride layer thickness less than 10 Angstroms. Still a further step 1905 includes providing a templating layer, outward of the interfacial nitride layer, and including a binary alloy having an alternating layer lattice structure. The sub-monolayer nitride layer and the templating layer are depicted at 1203, 1303 in FIGS. 16 and 17, respectively. A further step 1907 includes epitaxially growing a Heusler layer 1205, 1305 on the templating layer; the Heusler layer includes a Heusler material. Still further steps include, as at 1909, forming a tunnel barrier 1209, 1309 outward of the Heusler layer; and, as at 1911, forming a magnetic layer 1211, 1311 outward of the tunnel barrier. The method can also include providing and/or forming other elements seen in FIGS. 16 and 17 using techniques apparent to the skilled artisan, given the teachings herein. The cells can be integrated into an array by forming a plurality of cells at the same time and interconnecting them with wires, transistors, and peripheral circuitry in a manner apparent to the skilled artisan, given the teachings herein.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from half metallic Heusler multilayers with perpendicular magnetic anisotropy (PMA) in MRAMs and the like.

An integrated circuit in accordance with aspects of the present inventions can be employed in essentially any application and/or electronic system where Heusler layers with perpendicular magnetic anisotropy (PMA) in MRAMs and the like would be beneficial. Given the teachings of the present disclosure provided herein, one of ordinary skill in the art will be able to contemplate other implementations and applications of embodiments disclosed herein.

Figure 20:
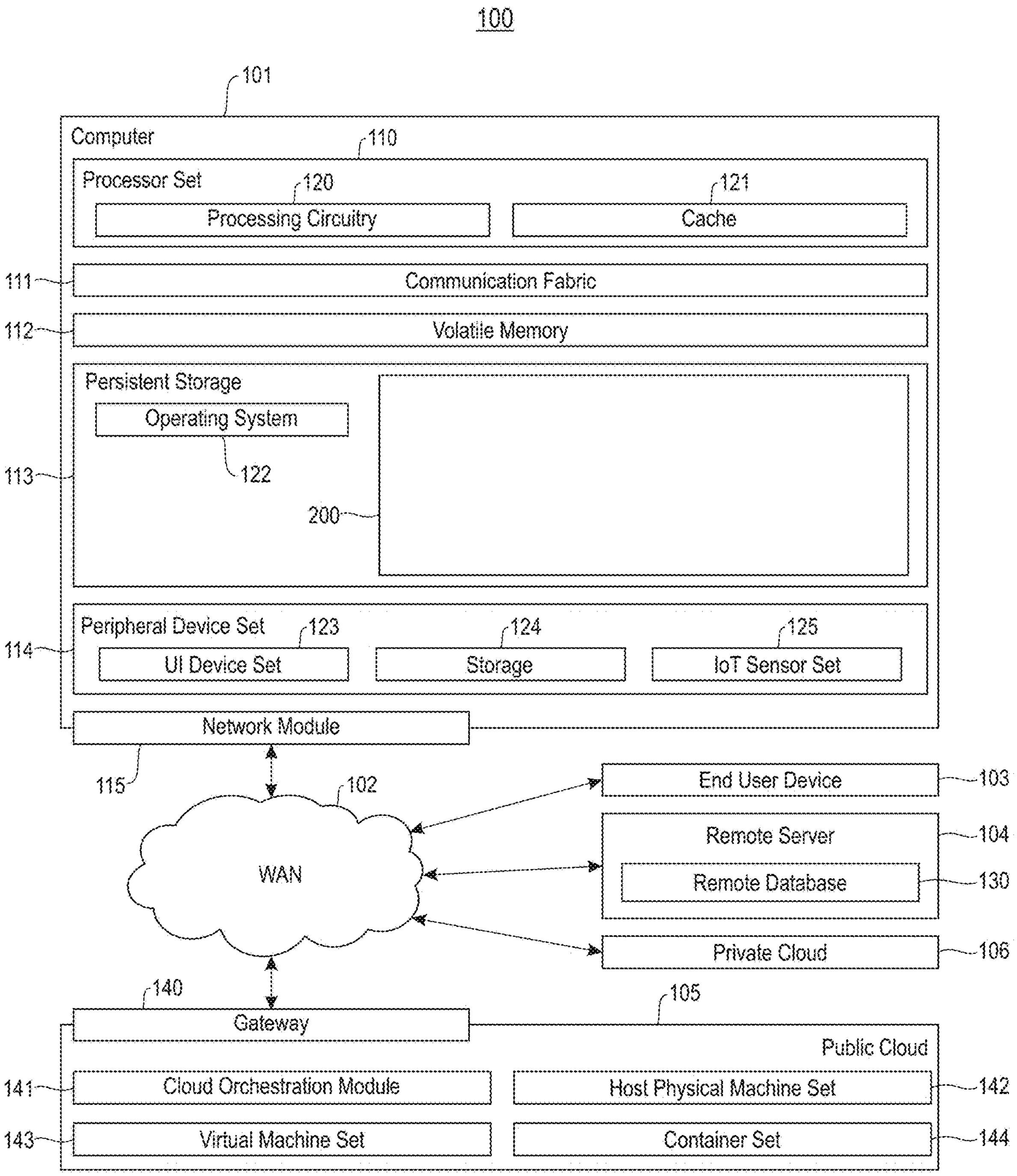
FIG. 20 depicts a computing environment according to an embodiment of the present invention (e.g., for implementing a design process such as that of FIG. 21)
Figure 21:
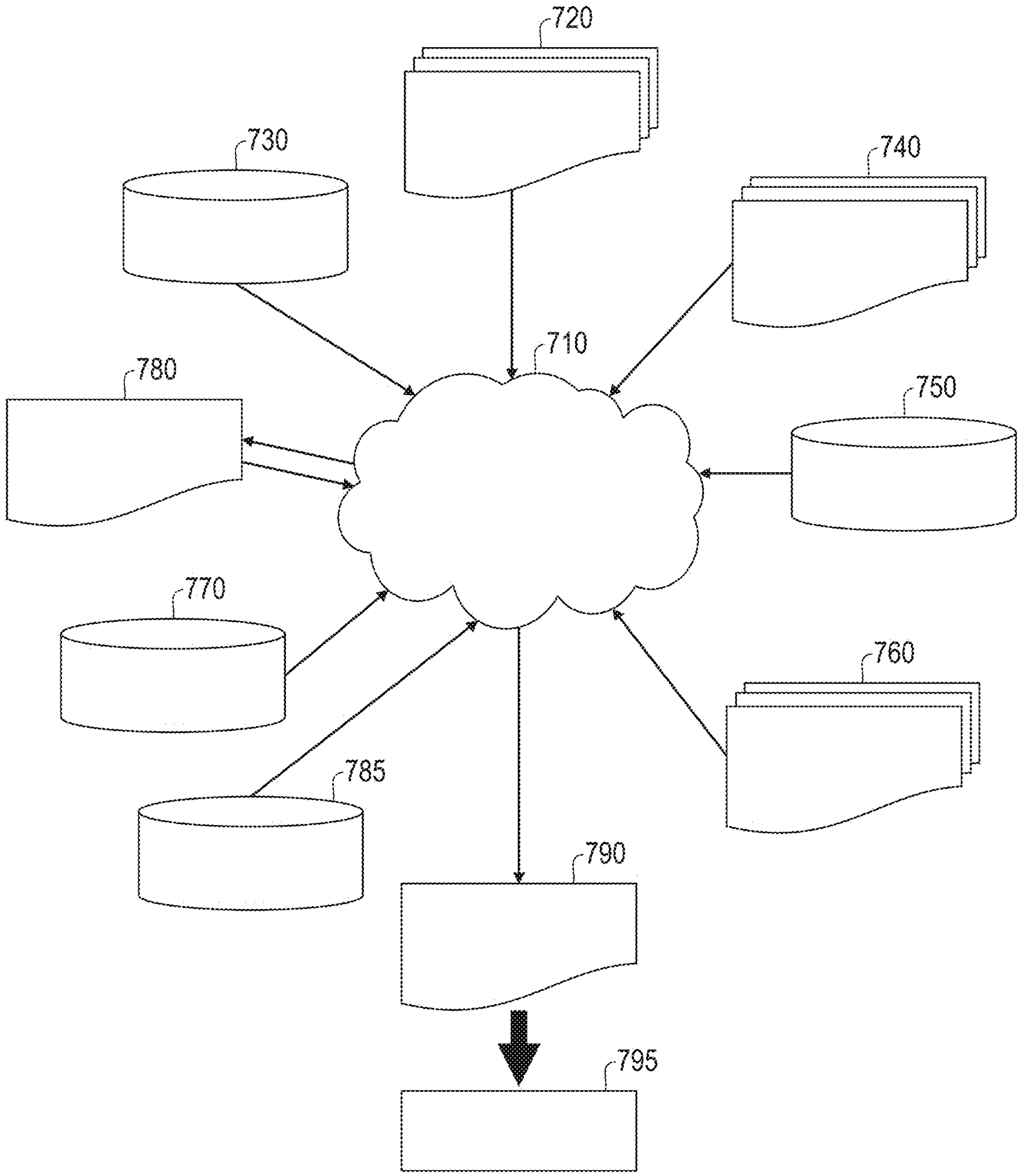
FIG. 21 is a flow diagram of a design process used in semiconductor design, manufacture, and/or test.

Reference should now be had to FIG. 20, which depicts a computing environment according to an embodiment of the present invention (e.g., for implementing a design process such as that of FIG. 21)

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Computing environment 100 contains an example of an environment for the execution of at least some of the computer code involved in performing the inventive methods, such as a system 200 for semiconductor design and/or control of semiconductor fabrication (see FIG. 21). In addition to block 200, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and block 200, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

COMPUTER 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 20. On the other hand, computer 101 is not required to be in a cloud except to any extent as may be affirmatively indicated.

PROCESSOR SET 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in block 200 in persistent storage 113.

COMMUNICATION FABRIC 111 is the signal conduction path that allows the various components of computer 101 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

PERSISTENT STORAGE 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface-type operating systems that employ a kernel. The code included in block 200 typically includes at least some of the computer code involved in performing the inventive methods.

PERIPHERAL DEVICE SET 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion-type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

NETWORK MODULE 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 103 is any computer system that is used and controlled by an end user (for example, a customer of an enterprise that operates computer 101), and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

REMOTE SERVER 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

PUBLIC CLOUD 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Exemplary Design Process Used in Semiconductor Design, Manufacture, and/or Test

One or more embodiments make use of computer-aided semiconductor integrated circuit design simulation, test, layout, and/or manufacture. In this regard, FIG. 21 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those that can be analyzed using techniques disclosed herein or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 21 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 790 may comprise a compiled, executable HDL simulation model that functionally simulates the devices to be analyzed.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., lib files). Design structure 790 may then proceed to a stage 795 where, for example, design structure 790: proceeds to tape-out, is released to manufacturing, is released to a mask house, is sent to another design house, is sent back to the customer, etc.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "bottom", "top", "above", "over", "under" and "below" are used to indicate relative positioning of elements or structures to each other as opposed to relative elevation. If a layer of a structure is described herein as "over" another layer, it will be understood that there may or may not be intermediate elements or layers between the two specified layers. If a layer is described as "directly on" another layer, direct contact of the two layers is indicated. As the term is used herein and in the appended claims, "about" means within plus or minus ten percent.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.76(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus, the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A magnetoresistive random-access memory cell, comprising:

a substrate;

a sub-monolayer non-magnetic nitride layer, outward of the substrate, and having a sub-monolayer non-magnetic nitride layer thickness less than 10 Angstroms;

a templating layer, outward of the sub-monolayer non-magnetic nitride layer, comprising a binary alloy having an alternating layer lattice structure;

a Heusler layer located outward of the templating layer, the Heusler layer comprising a Heusler compound and exhibiting perpendicular magnetic anisotropy (PMA);

a tunnel barrier outward of the Heusler layer; and a magnetic layer outward of the tunnel barrier.

2. The magnetoresistive random-access memory cell of claim 1, wherein:

the Heusler layer comprises a storage layer; and the magnetic layer comprises a reference layer.

3. The magnetoresistive random-access memory cell of claim 2, wherein the Heusler compound is selected from the group consisting of $Mn_3Ge$, $Mn_3Sn$, $Mn_3Sb$, $Mn_2CoSn$, $Mn_2FeSb$, $Mn_3CoAl$, $Mn_2CoGe$, $Mn_2CoSi$, $Mn_2CuSi$, $Co_2CrAl$, $Co_2CrSi$, $Co_2MnSb$, and $Co_2MnSi$.

4. The magnetoresistive random-access memory cell of claim 3, wherein the Heusler layer has a thickness of less than 5 nm.

5. The magnetoresistive random-access memory cell of claim 4, wherein the tunnel barrier is selected from the group consisting of magnesium oxide and magnesium aluminum oxide.

6. The magnetoresistive random-access memory cell of claim 5, wherein the tunnel barrier comprises magnesium oxide.

7. The magnetoresistive random-access memory cell of claim 5, wherein the tunnel barrier comprises $Mg_{1-z}Al_{2+(2/3)z}O_4$, wherein $-0.5<z<0.5$.

8. The magnetoresistive random-access memory cell of claim 5, wherein the binary alloy is represented by $A_{1-x}E_x$, wherein A is a transition metal element and E is a main group element including at least one of aluminum and gallium, and x is in the range from 0.42 to 0.55.

9. The magnetoresistive random-access memory cell of claim 2, wherein the Heusler compound comprises $Mn_3Ge$.

10. The magnetoresistive random-access memory cell of claim 1, wherein:
- the Heusler layer comprises a reference layer; and
- the magnetic layer comprises a storage layer.

11. The magnetoresistive random-access memory cell of claim 10, wherein the Heusler compound is selected from the group consisting of $Mn_3Ge$, $Mn_3Sn$, $Mn_3Sb$, $Mn_2CoSn$, $Mn_2FeSb$, $Mn_3CoAl$, $Mn_2CoGe$, $Mn_2CoSi$, $Mn_2CuSi$, $Co_2CrAl$, $Co_2CrSi$, $Co_2MnSb$, and $Co_2MnSi$.

12. The magnetoresistive random-access memory cell of claim 11, wherein the Heusler layer has a thickness of less than 5 nm.

13. The magnetoresistive random-access memory cell of claim 12, wherein the tunnel barrier is selected from the group consisting of magnesium oxide and magnesium aluminum oxide.

14. The magnetoresistive random-access memory cell of claim 13, wherein the tunnel barrier comprises magnesium oxide.

15. The magnetoresistive random-access memory cell of claim 13, wherein the tunnel barrier comprises $Mg_{1-z}Al_{2+(2/3)z}O_4$, wherein $-0.5<z<0.5$.

16. The magnetoresistive random-access memory cell of claim 13, wherein the binary alloy is represented by $A_{1-x}E_x$, wherein A is a transition metal element and E is a main group element including at least one of aluminum and gallium, and x is in the range from 0.42 to 0.55.

17. The magnetoresistive random-access memory cell of claim 10, wherein the Heusler compound comprises $Mn_3Ge$.

18. The magnetoresistive random-access memory cell of claim 1, wherein the alternating layer lattice structure of the templating layer comprises a cesium chloride structure.

19. The magnetoresistive random-access memory cell of claim 1, wherein the sub-monolayer non-magnetic nitride layer has over-stoichiometric nitrogen composition.

20. A magnetoresistive random-access memory cell, comprising:
- a substrate;
- a non-magnetic tantalum nitride layer, outward of the substrate, and having a non-magnetic tantalum nitride layer thickness ranging from a sub-monolayer to a maximum≤10 Angstroms+/−10%;
- a templating layer, outward of the non-magnetic tantalum nitride layer, comprising a binary alloy having an alternating layer lattice structure;
- a Heusler layer located outward of the templating layer, the Heusler layer comprising a Heusler compound and exhibiting perpendicular magnetic anisotropy (PMA);
- a tunnel barrier outward of the Heusler layer; and
- a magnetic layer outward of the tunnel barrier.

21. The magnetoresistive random-access memory cell of claim 20, wherein:
- the Heusler layer comprises a reference layer;
- the magnetic layer comprises a storage layer; and
- the Heusler compound is selected from the group consisting of $Mn_3Ge$, $Mn_3Sn$, $Mn_3Sb$, $Mn_2CoSn$, $Mn_2FeSb$, $Mn_3CoAl$, $Mn_2CoGe$, $Mn_2CoSi$, $Mn_2CuSi$, $Co_2CrAl$, $Co_2CrSi$, $Co_2MnSb$, and $Co_2MnSi$.

22. A magnetoresistive random-access memory array, comprising:
- a plurality of bit lines and a plurality of complementary bit lines forming a plurality of bit line-complementary bit line pairs;
- a plurality of word lines intersecting the plurality of bit line pairs at a plurality of cell locations; and
- a plurality of magnetoresistive random-access memory cells located at each of the plurality of cell locations, each of the magnetoresistive random-access memory cells being electrically connected to a corresponding bit line and selectively interconnected to a corresponding one of the complementary bit lines under control of a corresponding one of the word lines, each of the plurality of magnetoresistive random-access memory cells comprising:
  - a substrate;
  - a sub-monolayer non-magnetic nitride layer, outward of the substrate, and having a sub-monolayer non-magnetic nitride layer thickness less than 10 Angstroms;
  - a templating layer, outward of the sub-monolayer non-magnetic nitride layer, comprising a binary alloy having an alternating layer lattice structure;
  - a Heusler layer located outward of the templating layer, the Heusler layer comprising a Heusler compound and exhibiting perpendicular magnetic anisotropy (PMA);
  - a tunnel barrier outward of the Heusler layer; and
  - a magnetic layer outward of the tunnel barrier.

23. The magnetoresistive random-access memory array of claim 22, wherein:
- the Heusler layer comprises a storage layer;
- the magnetic layer comprises a reference layer,
- the sub-monolayer non-magnetic nitride layer is a sub-monolayer non-magnetic tantalum nitride layer; and
- the Heusler compound is selected from the group consisting of $Mn_3Ge$, $Mn_3Sn$, $Mn_3Sb$, $Mn_2CoSn$, $Mn_2FeSb$, $Mn_3CoAl$, $Mn_2CoGe$, $Mn_2CoSi$, $Mn_2CuSi$, $Co_2CrAl$, $Co_2CrSi$, $Co_2MnSb$, and $Co_2MnSi$.

24. A method of forming a magnetoresistive random-access memory cell, comprising:
- providing a substrate;
- forming a sub-monolayer non-magnetic nitride layer, outward of the substrate, and having a sub-monolayer non-magnetic nitride layer thickness less than 10 Angstroms;
- providing a templating layer, outward of the sub-monolayer non-magnetic nitride layer, and comprising a binary alloy having an alternating layer lattice structure;

epitaxially growing a Heusler layer on the templating layer, the Heusler layer comprising a Heusler material;
forming a tunnel barrier outward of the Heusler layer; and
forming a magnetic layer outward of the tunnel barrier.

25. A hardware description language (HDL) design structure encoded on a machine-readable data storage medium, the HDL design structure comprising elements that when processed in a computer-aided design system generates a machine-executable representation of a magnetoresistive random-access memory cell, wherein the (HDL design structure) comprises:
a substrate;
a sub-monolayer non-magnetic nitride layer, outward of the substrate, and having a sub-monolayer non-magnetic nitride layer thickness less than 10 Angstroms;
a templating layer, outward of the sub-monolayer non-magnetic nitride layer, comprising a binary alloy having an alternating layer lattice structure;
a Heusler layer located outward of the templating layer, the Heusler layer comprising a Heusler compound and exhibiting perpendicular magnetic anisotropy (PMA);
a tunnel barrier outward of the Heusler layer; and
a magnetic layer outward of the tunnel barrier.

* * * * *